United States Patent
Mori et al.

(10) Patent No.: US 7,386,018 B2
(45) Date of Patent: Jun. 10, 2008

(54) MODE-LOCKED LASER AND OPTICAL MULTI-CARRIER SOURCE USING SAME

(75) Inventors: Kunihiko Mori, Yokosuka (JP); Kenji Sato, Yokosuka (JP); Takuya Ohara, Yokohama (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 278 days.

(21) Appl. No.: 10/555,658

(22) PCT Filed: Feb. 3, 2005

(86) PCT No.: PCT/JP2005/001615

§ 371 (c)(1),
(2), (4) Date: Nov. 4, 2005

(87) PCT Pub. No.: WO2005/076422

PCT Pub. Date: Aug. 18, 2005

(65) Prior Publication Data

US 2007/0091941 A1    Apr. 26, 2007

(30) Foreign Application Priority Data

Feb. 4, 2004    (JP)    .............................. 2004-028079

(51) Int. Cl.
*H01S 3/098* (2006.01)
(52) U.S. Cl. .................................... 372/18; 372/50.123
(58) Field of Classification Search ................. 372/18, 372/50.123
See application file for complete search history.

(56) References Cited

U.S. PATENT DOCUMENTS 6,282,214 B1    8/2001    Goto et al.

(Continued)

FOREIGN PATENT DOCUMENTS

CN    1398029    2/2003

(Continued)

OTHER PUBLICATIONS

TaKara, H. et al., "More than 1000 channel optical frequency chain generation from single supercontinuum source with 12.5 GHz channel spacing", In: Electronics Letters, vol. 36, Issue 25, Dec. 7, 2000, pp. 2089 to 2090.

(Continued)

*Primary Examiner*—Dung (Michael) T. Nguyen
(74) *Attorney, Agent, or Firm*—Harness, Dickey & Pierce, P.L.C.

(57) ABSTRACT

A mode-locked laser serves as a light source for stabilizing the frequency of each optical carrier and generates high-quality optical multi-carrier. The mode-locked laser is equipped with a master laser for generating master laser light; a mode-locked laser section including in an optical resonator at least a modulating section, am amplifying section, and a bandwidth limiting section for reducing mode partition noise; and a signal generating section for generating a periodic signal that serves for mode locking of the mode-locked laser section and is to be applied to the modulating section. The master laser light is input to the optical resonator of the mode-locked laser section to cause injection locking. An optical multi-carrier source is constructed by combining this mode-locked laser with a waveguided optical nonlinear medium.

19 Claims, 20 Drawing Sheets

U.S. PATENT DOCUMENTS

| | | | |
|---|---|---|---|
| 6,356,693 | B1 | 3/2002 | Shimizu et al. |
| 6,795,479 | B2 | 9/2004 | Yokoyama |
| 2003/0197918 | A1* | 10/2003 | Ng et al. ............... 359/332 |
| 2004/0076199 | A1* | 4/2004 | Wipiejewski et al. ......... 372/26 |

FOREIGN PATENT DOCUMENTS

| | | |
|---|---|---|
| JP | 03-078269 | 4/1991 |
| JP | 06-167875 | 6/1996 |
| JP | 08-148749 A | 6/1996 |
| JP | 09-236834 | 9/1997 |
| JP | 09-318832 A | 12/1997 |
| JP | 10-213828 | 8/1998 |
| JP | 11-004037 | 1/1999 |
| JP | 11-145554 A | 5/1999 |
| JP | 11-284274 A | 10/1999 |
| JP | 2000-151000 A | 5/2000 |
| JP | 2000-277849 A | 10/2000 |
| JP | 2000-357840 | 12/2000 |

OTHER PUBLICATIONS

Mori, K. et al., "Flatly broadened supercontinuum spectrum generated in a dispersion decreasing fibre with convex dispersion profile", In: Electronics Letters, vol. 33, Issue 21, Oct. 9, 1997, pp. 1806 to 1808.

Hansen, K.P. et al., "Fully dispersion controlled triangular-core nonlinear photonic crystal fiber", Optical Fiber Communication Conference and Exhibit, OFC 2003, vol. 3, Mar. 23-28, 2003, pp. PD 2-1 to PD 2-3.

K. Imai et al., "500 Gb/s (50+10 Gb/s) WDM Transmission over 4,000 km Using Broadband EDFAs and Low Dispersion Slope Fiber", OFC/IOOC '99 Postdeadline Papers.

Hiro Suzuki et al., "12.5 GHz Spaced 1.28 Tb/s (512-Channel+2.5 Gb/s) Super-Dense WDM Transmission over 320 km SMF Using Multiwavelength Generation Technique," IEEE Photonics Technology Letters, vol. 14, No. 3, Mar. 2002.

Shigeru Ishii et al., "Longitudinal Mode Dependence of Transmission Characteristics for Injection Locked FP-LD," The 2002 General Assembly of the Institute of Electronics, Information and Communication Engineers, B-10-155 (with English summary).

Mitsuhiro Teshima et al., "Experimental Investigation of Injection Locking of Fundamental and Subharmonic Frequency-Modulated Active Mode-Locked Laser Diodes," IEEE Journal of Quantum Electronics, vol. 34, No. 9, Sep. 9, 1998.

Takashi Yamamoto et al., "Low-Noise Optical Frequency Comb Generation Using Phase Modulator," 1st Microwave/Millimeter Wave Photonics (MWP) Research Meeting, The Institute of Electronics, Information and Communication Engineers, MWP 03-4 (Oct. 2003) (with English translation).

* cited by examiner

[FIG. 1]
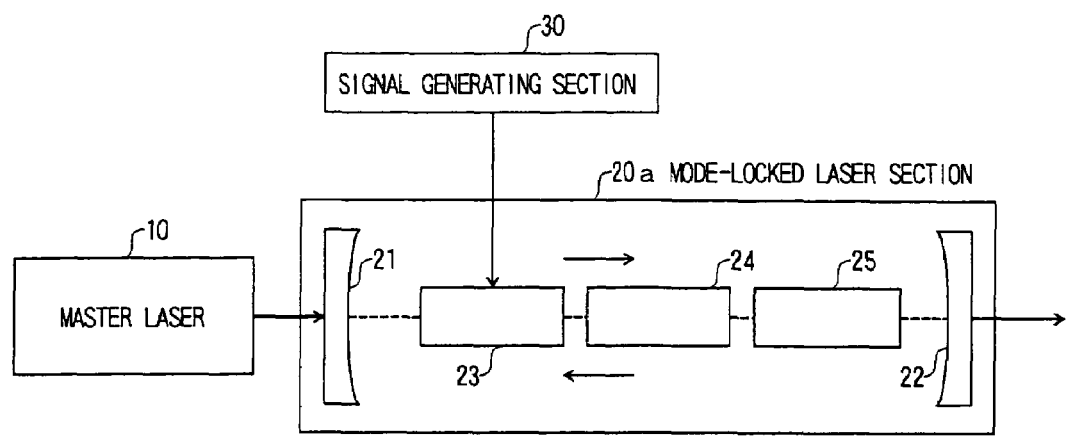
[FIG. 2]
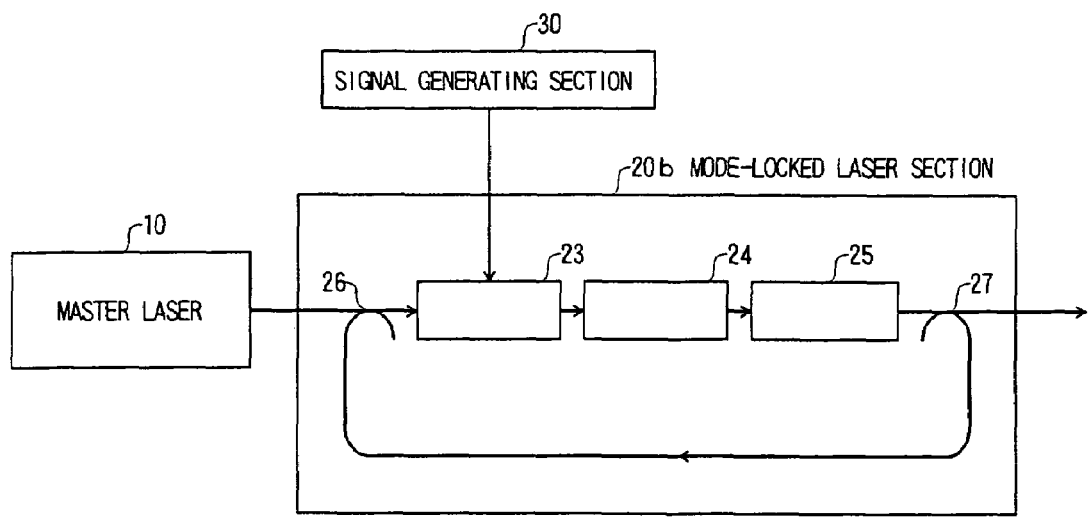

[FIG. 3]
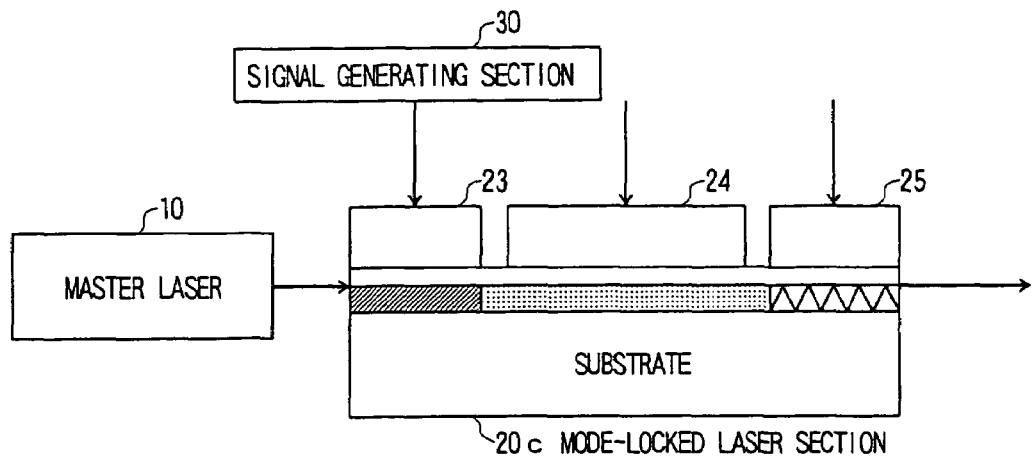
[FIG. 4]
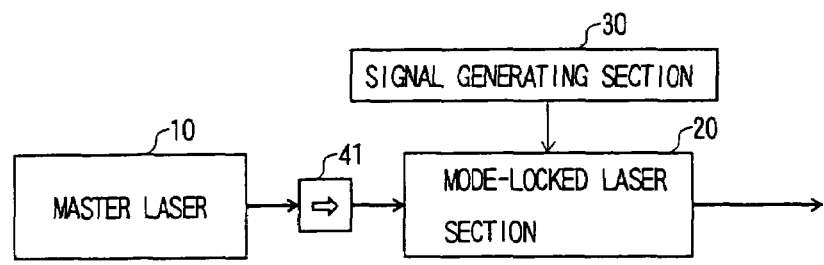
[FIG. 5]
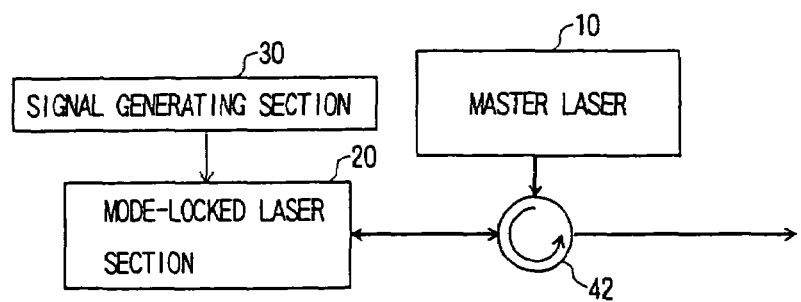

[FIG. 6]
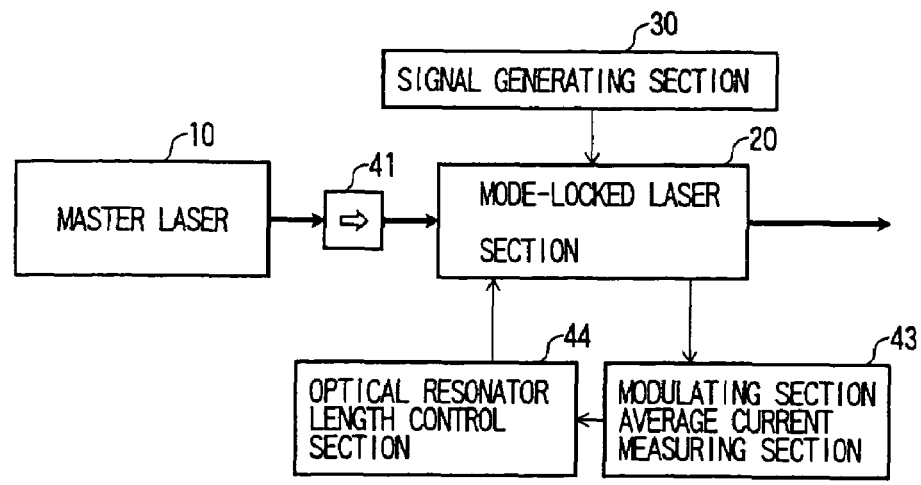
[FIG. 7]
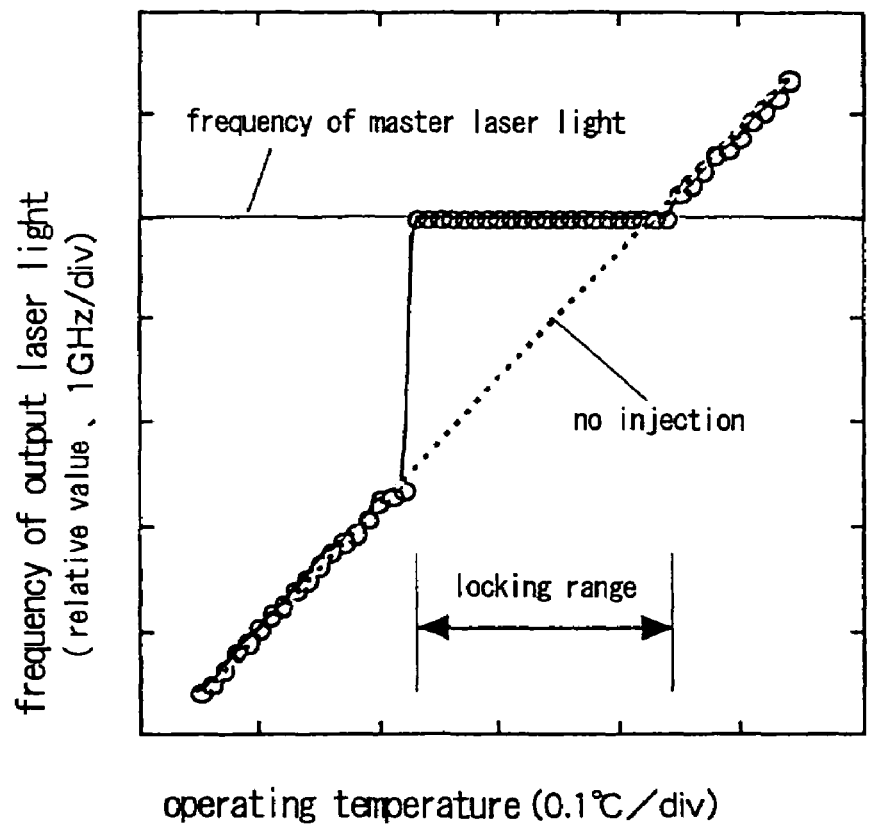

[FIG. 8]
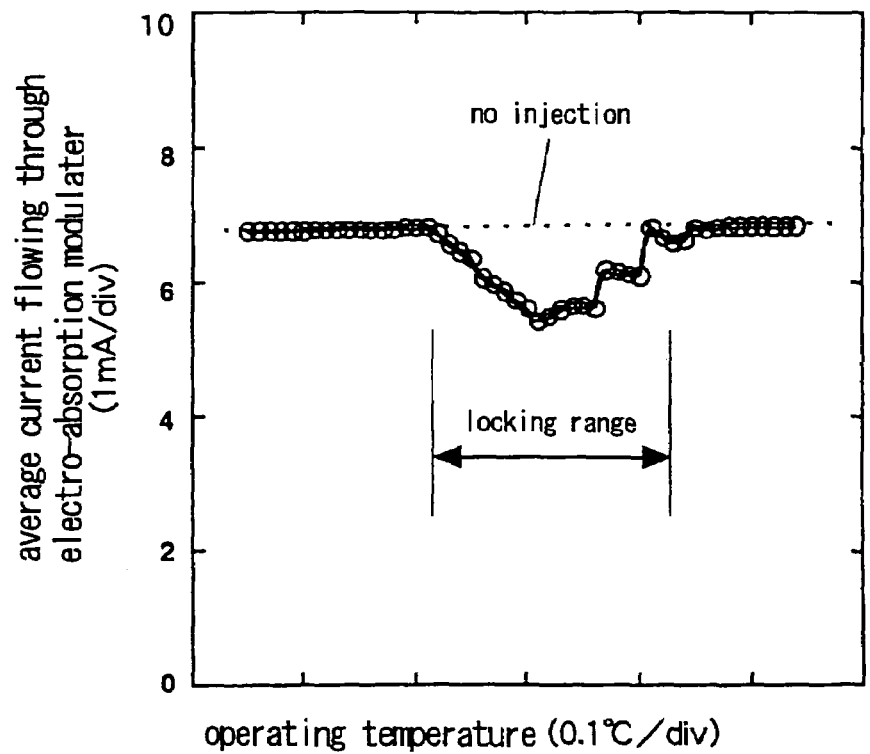
[FIG. 9]
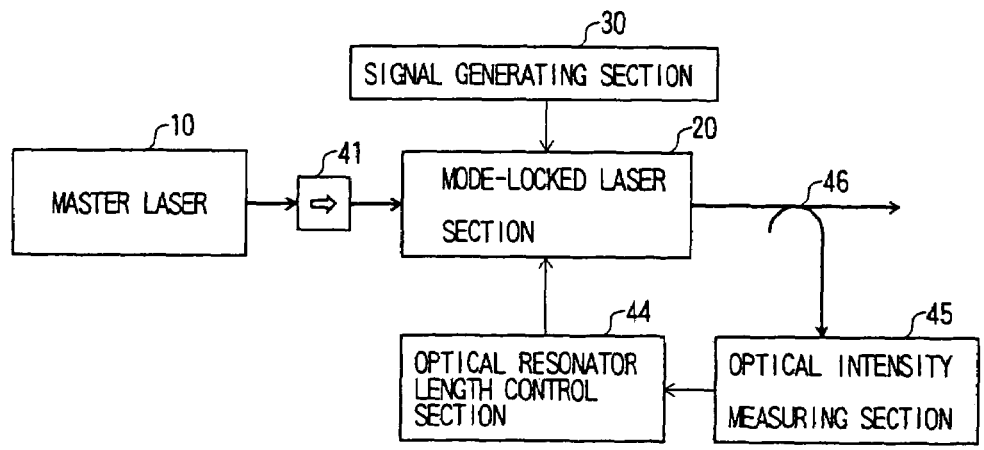

[FIG. 10]
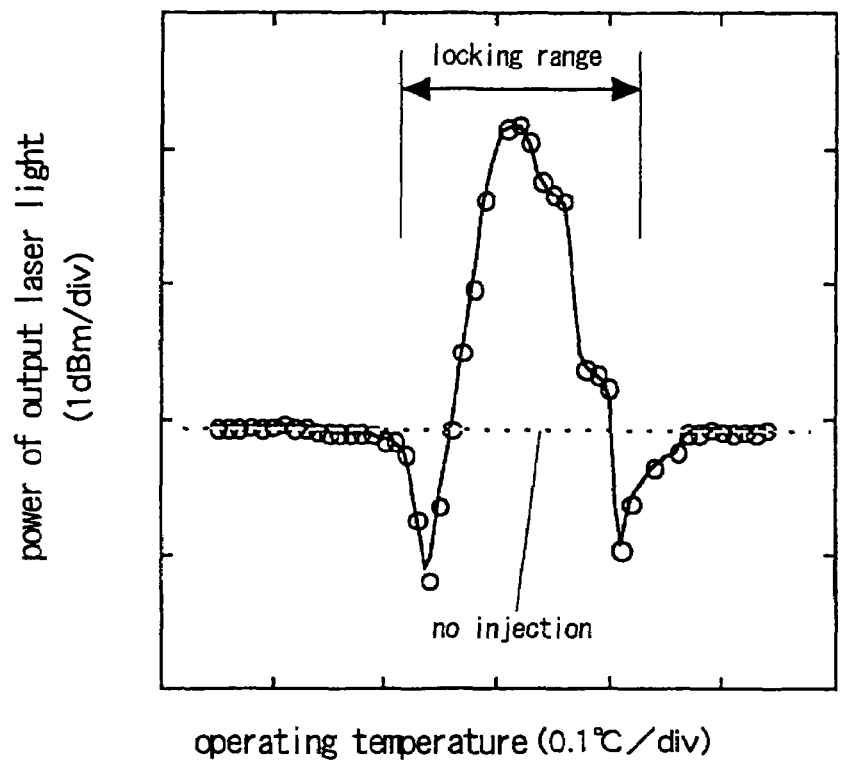
[FIG. 11]
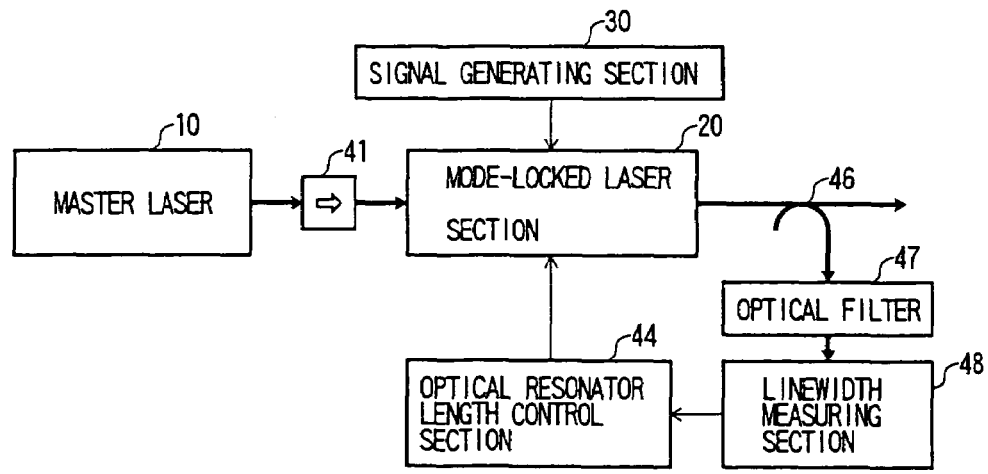

[FIG. 12]
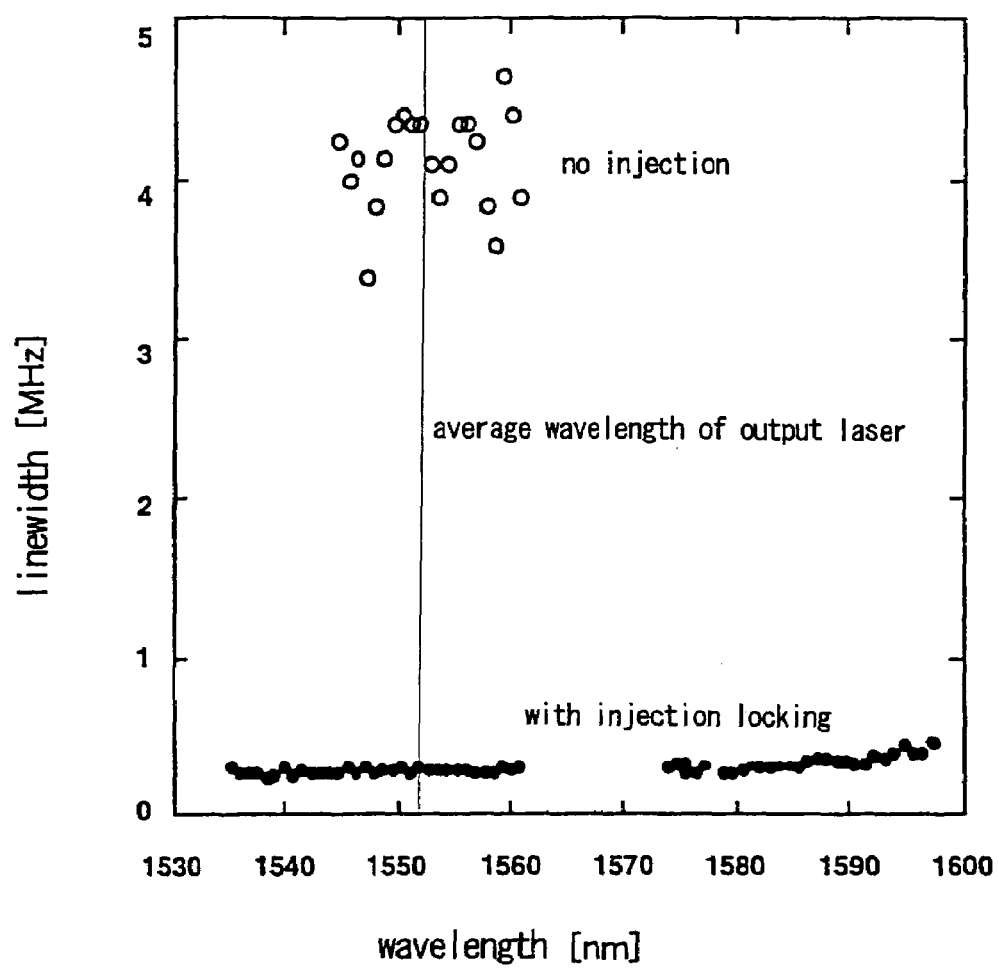

[FIG. 13]
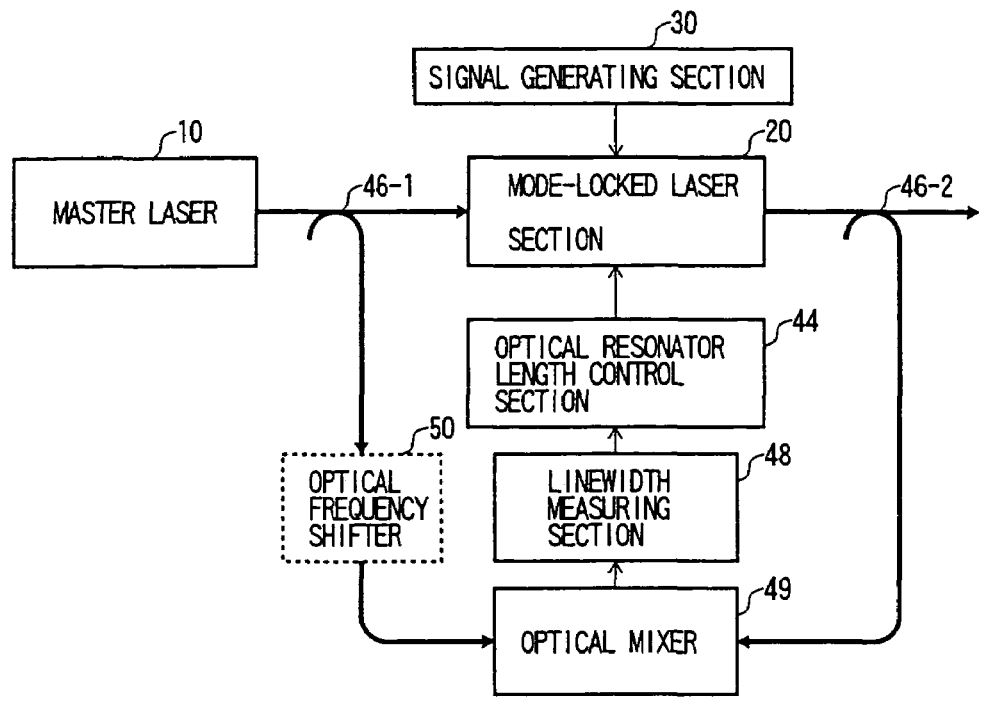
[FIG. 14]
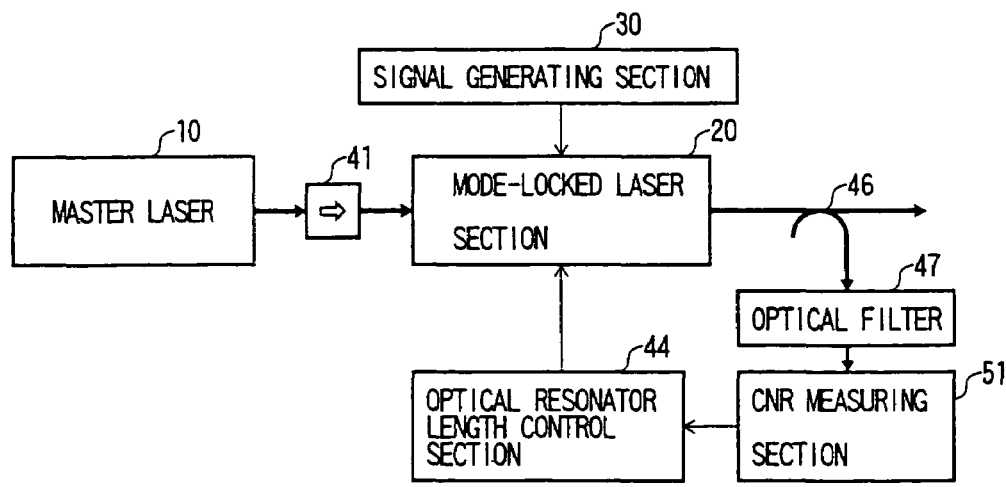

[FIG. 15]
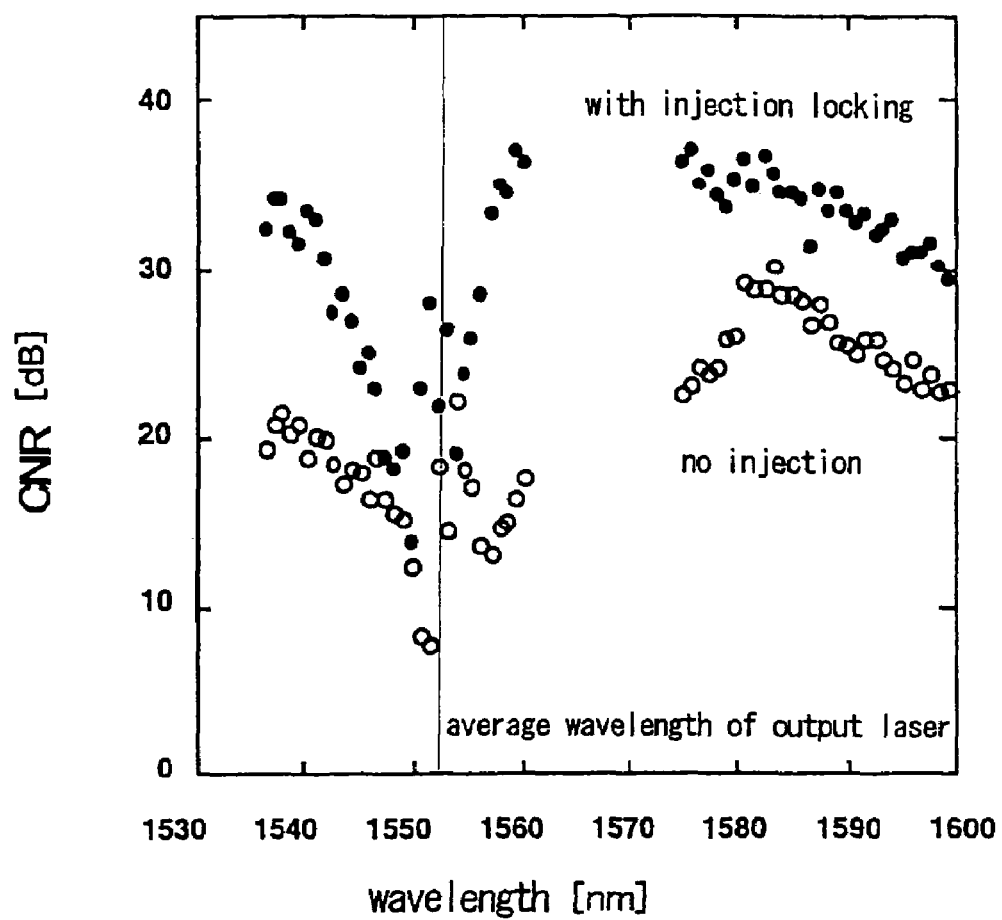

[FIG. 16]
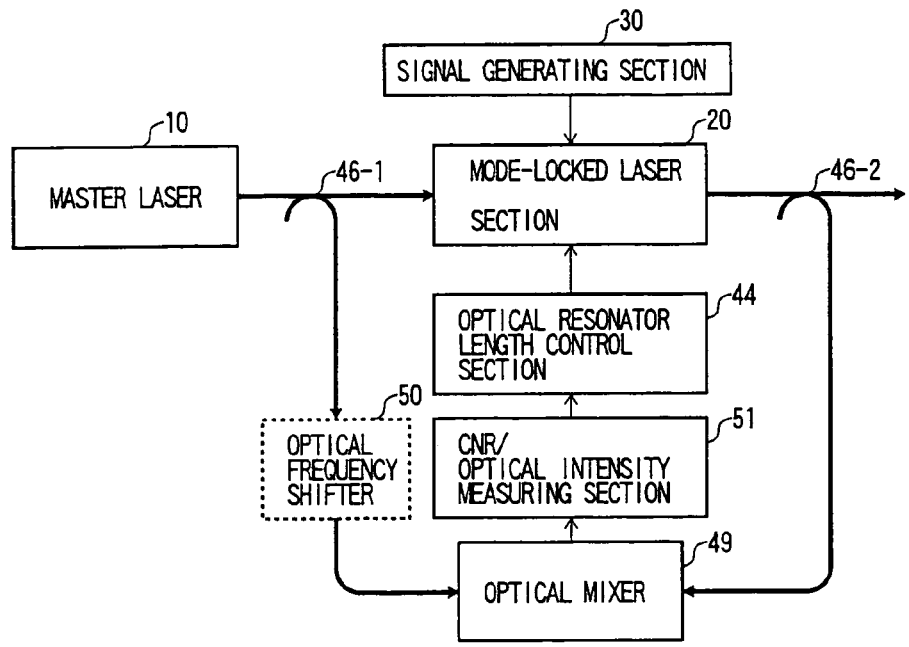
[FIG. 17]
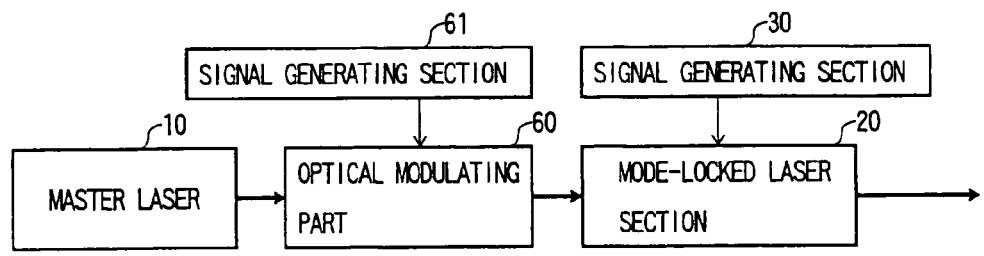

[FIG. 18]
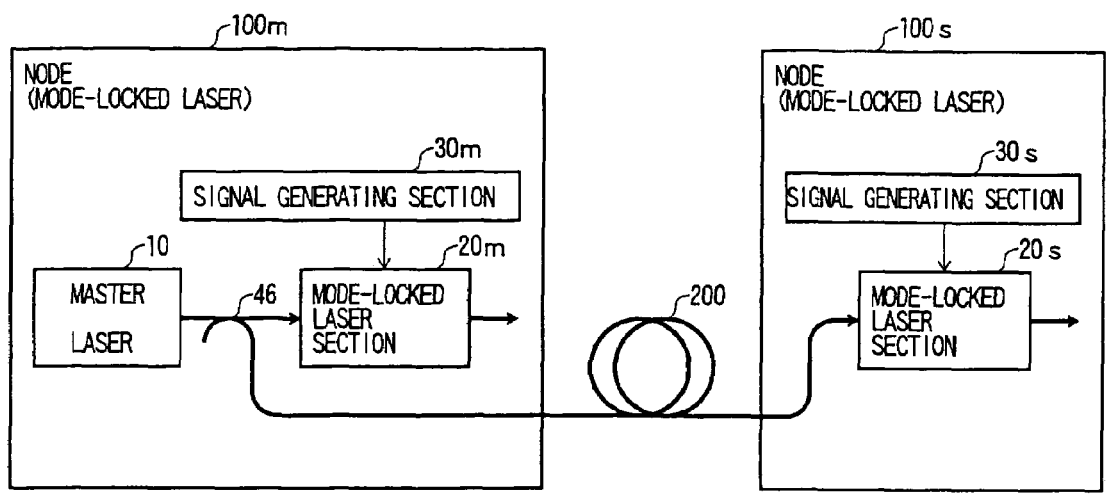
[FIG. 19]
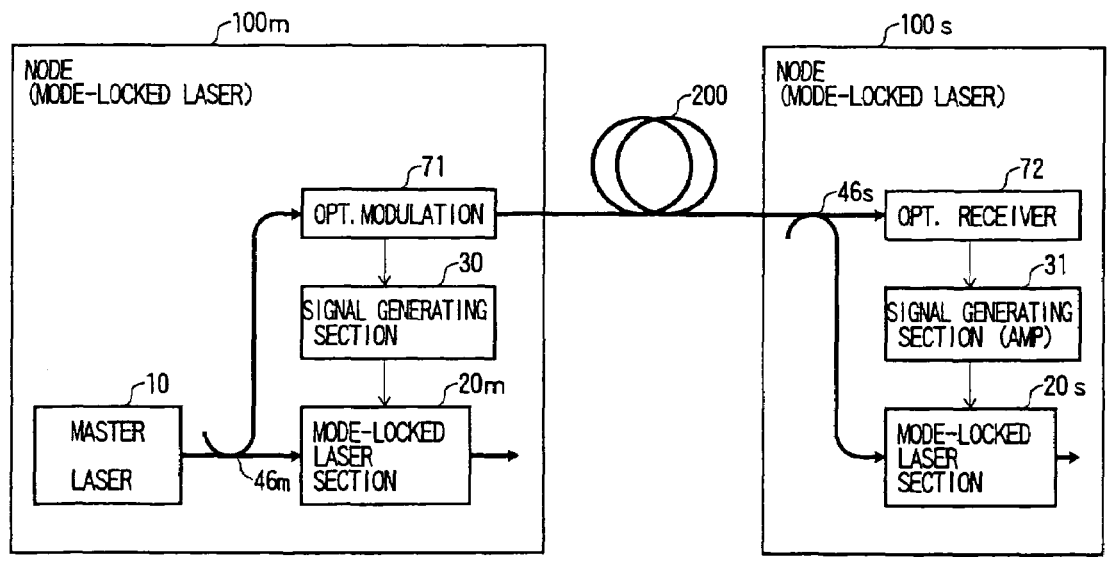

[FIG. 20]
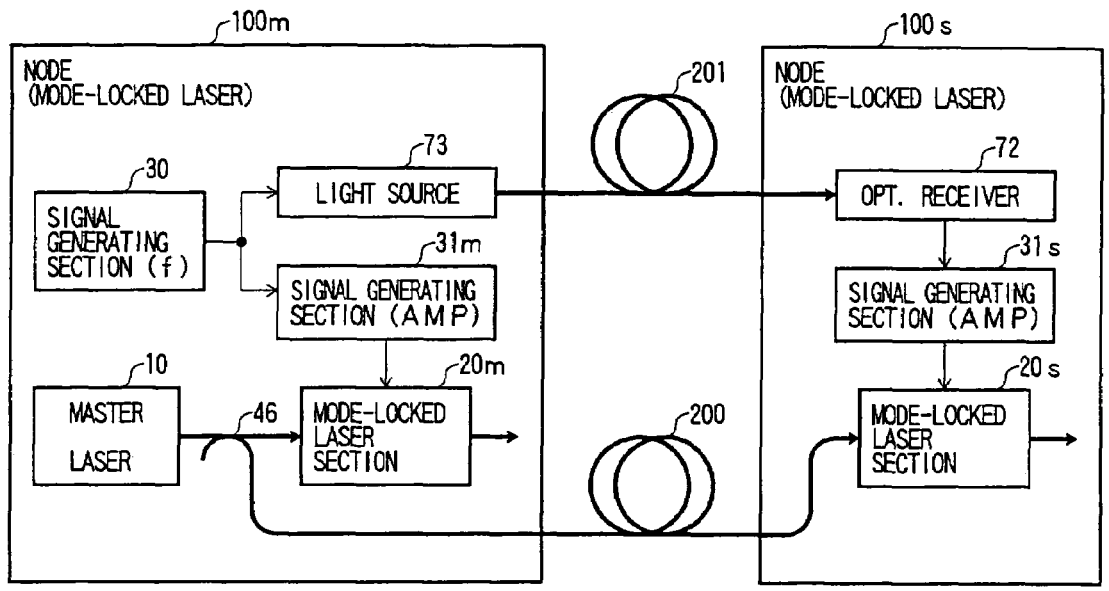
[FIG. 21]
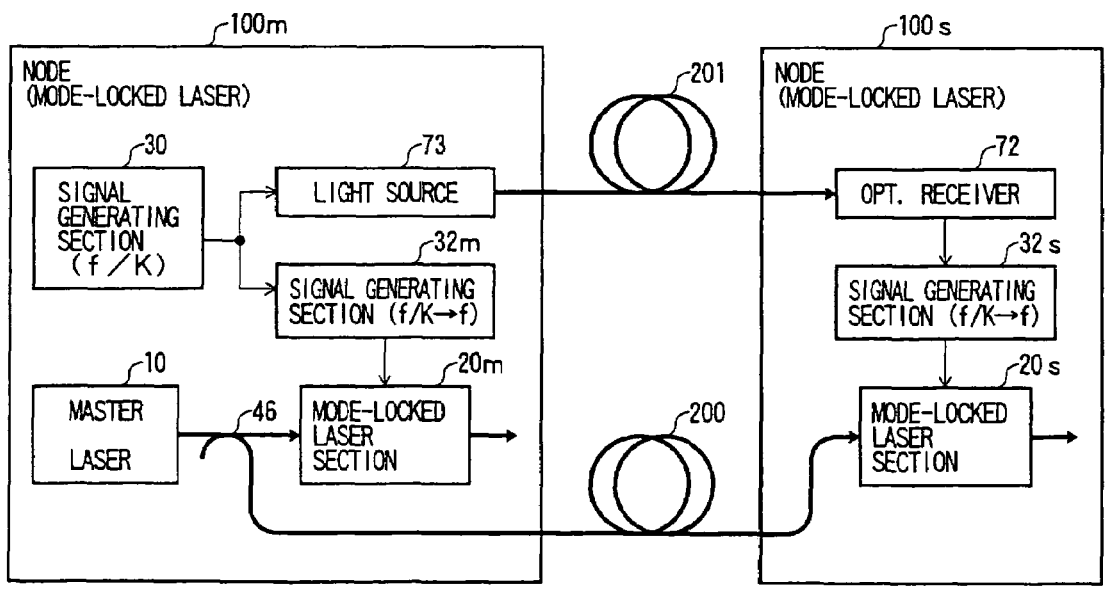

[FIG. 22]
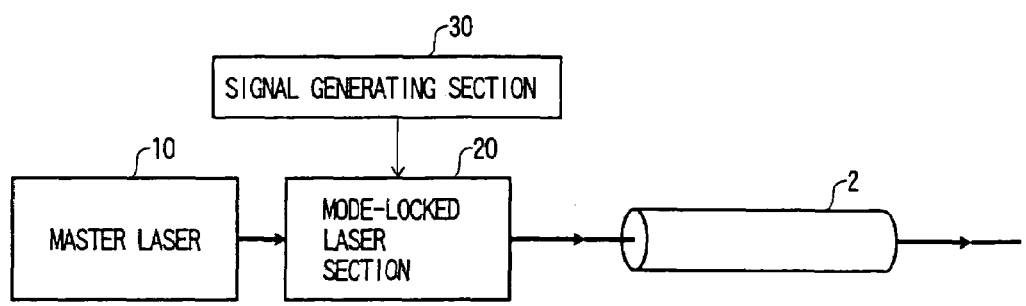
[FIG. 23]
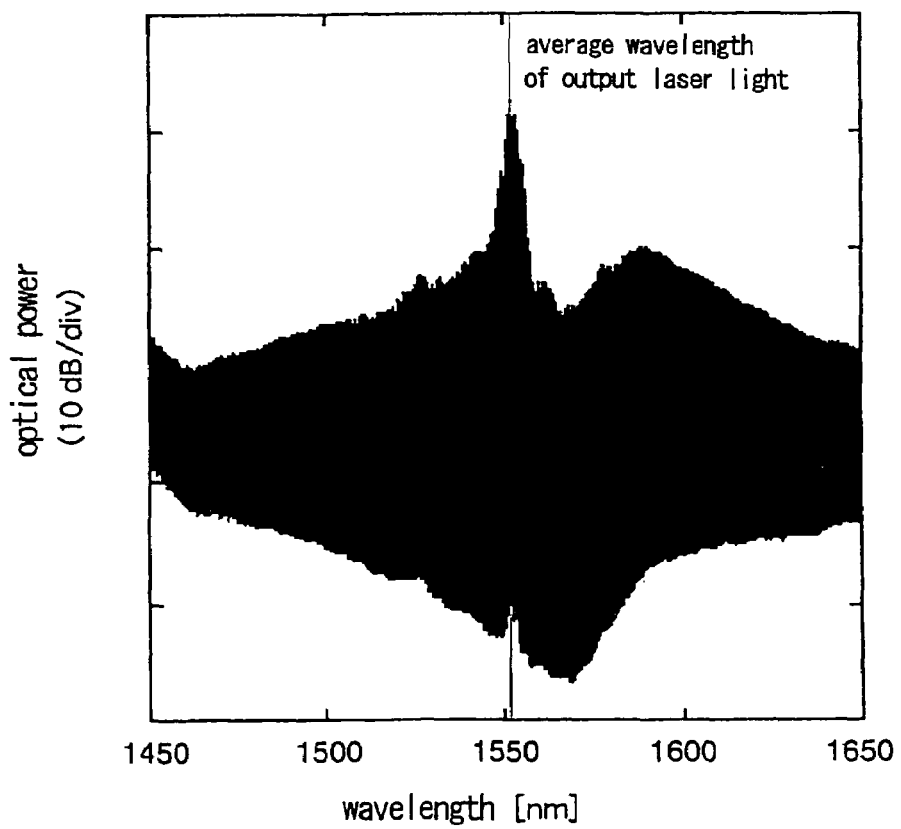

[FIG. 24]
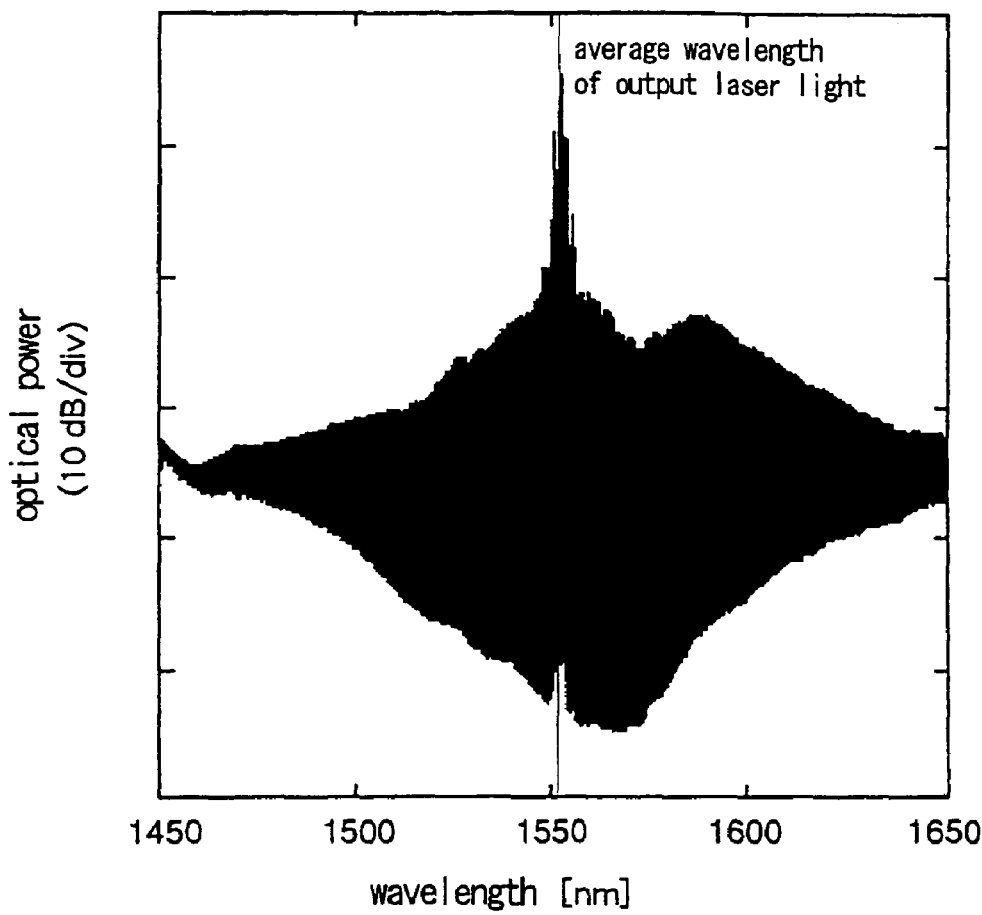
[FIG. 25]
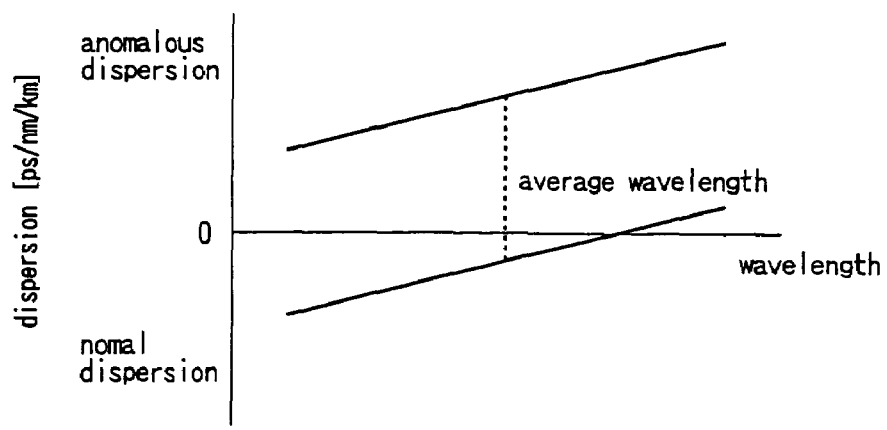

[FIG. 26]
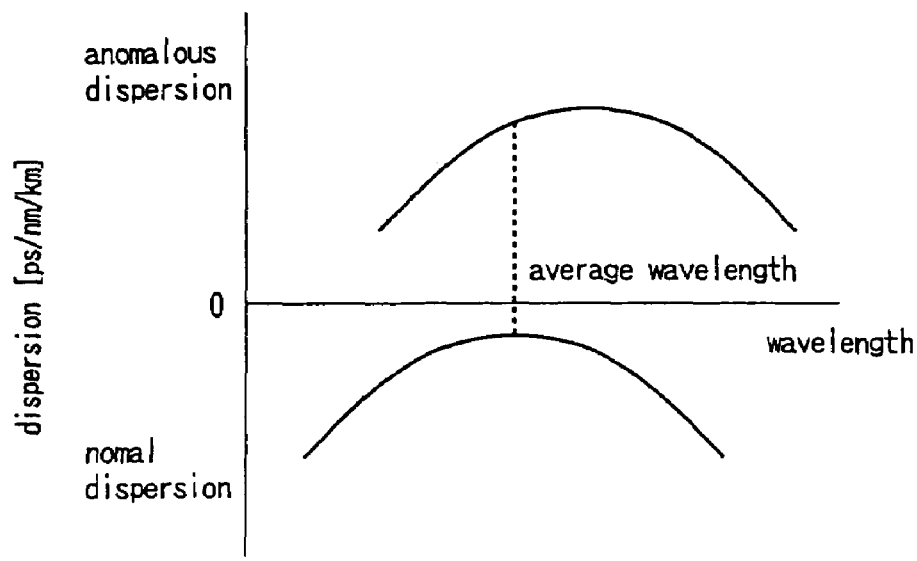
[FIG. 27]
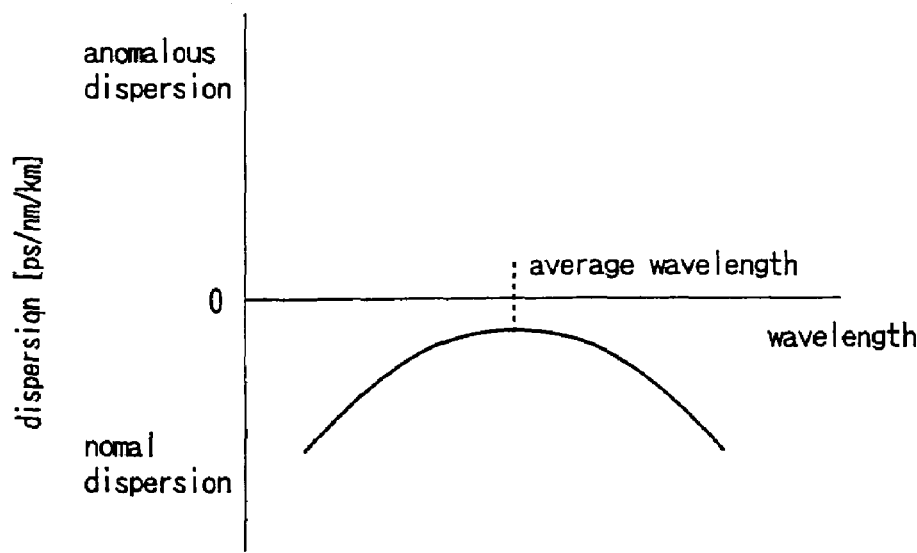

[FIG. 28]
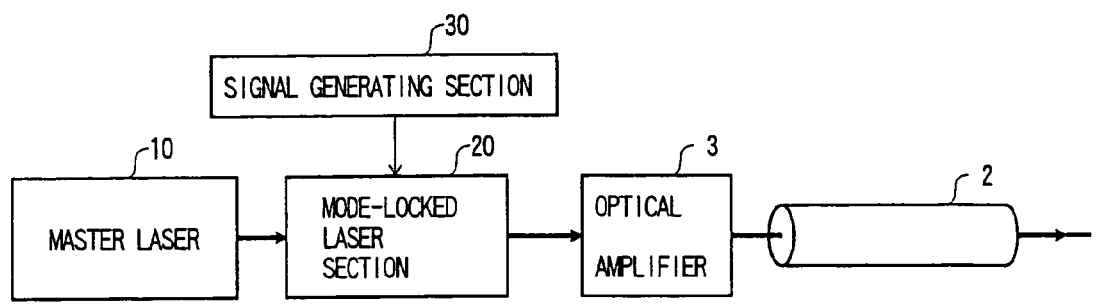
[FIG. 29]
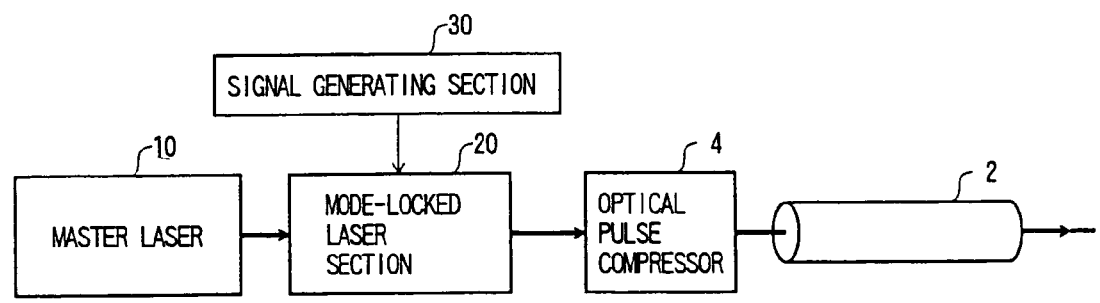

[FIG. 30]
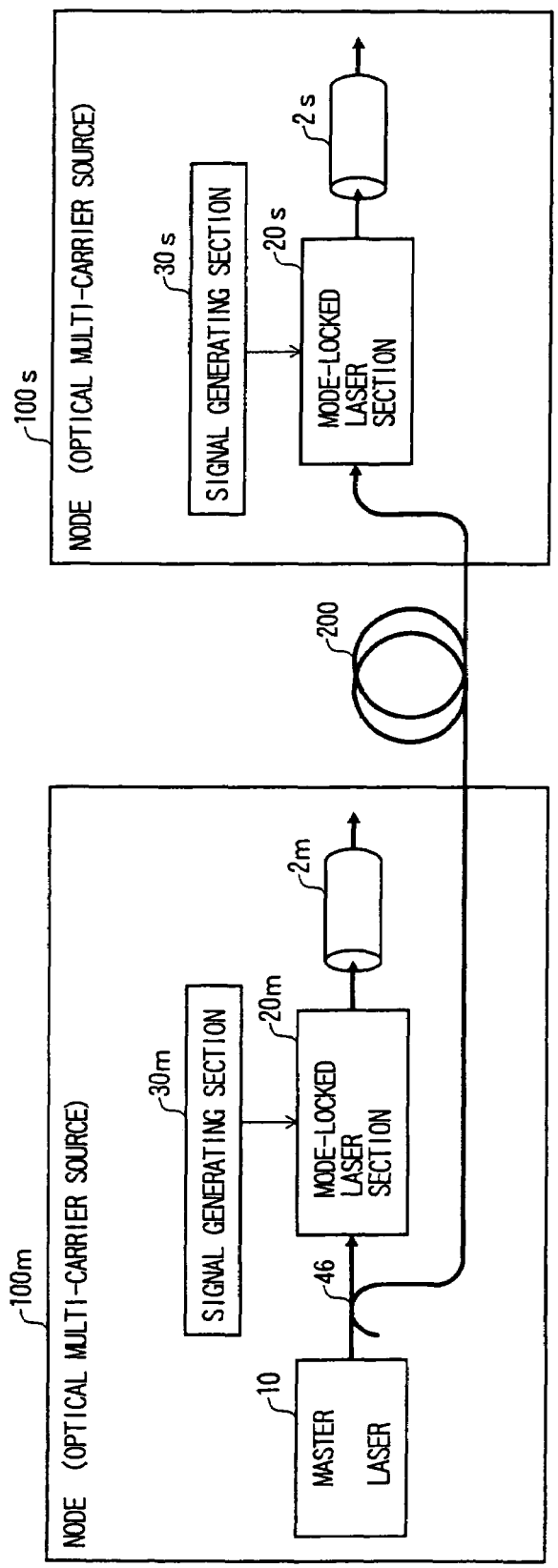

[FIG. 31]
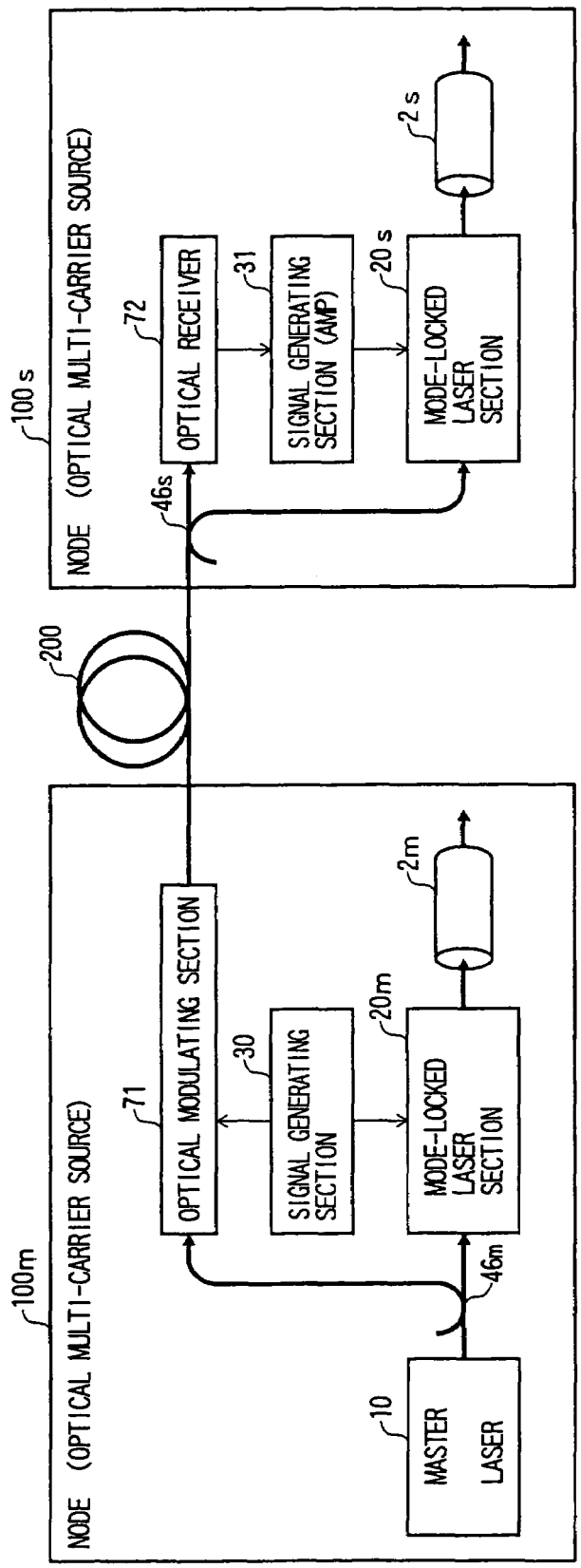

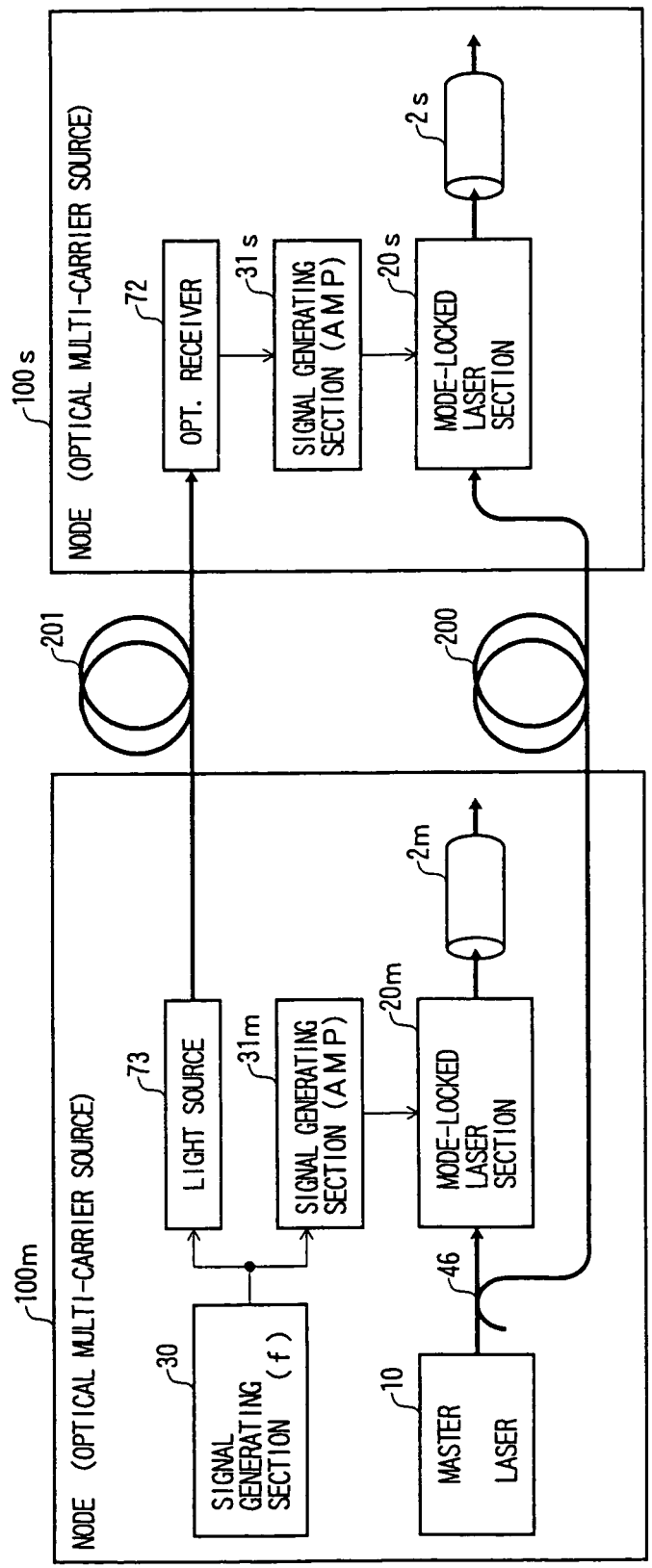
[FIG. 32]

[FIG. 33]
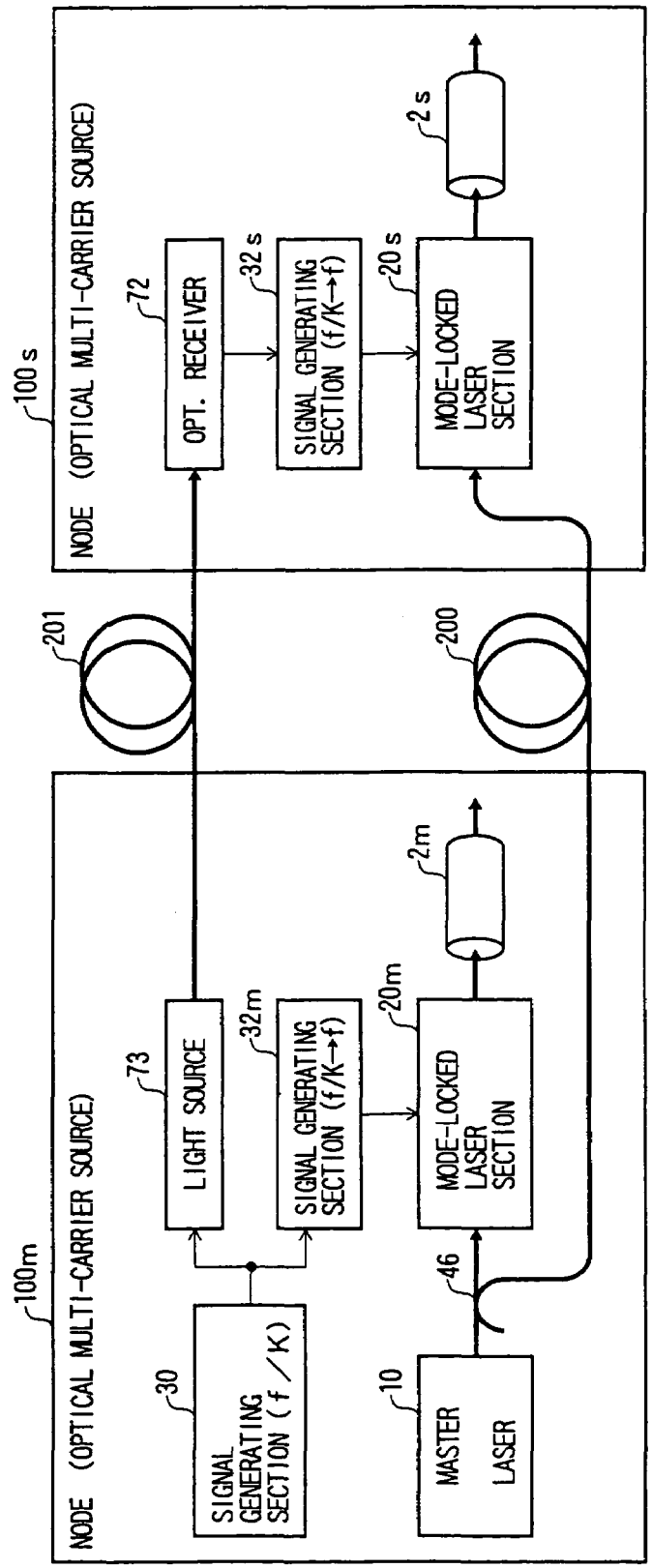

[FIG. 34]
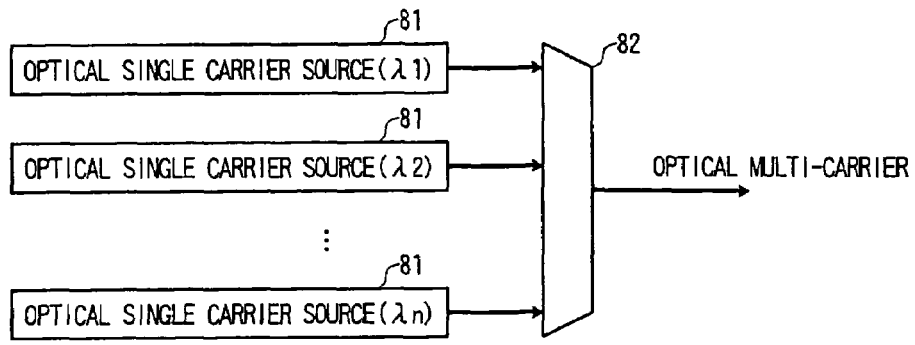
[FIG. 35]
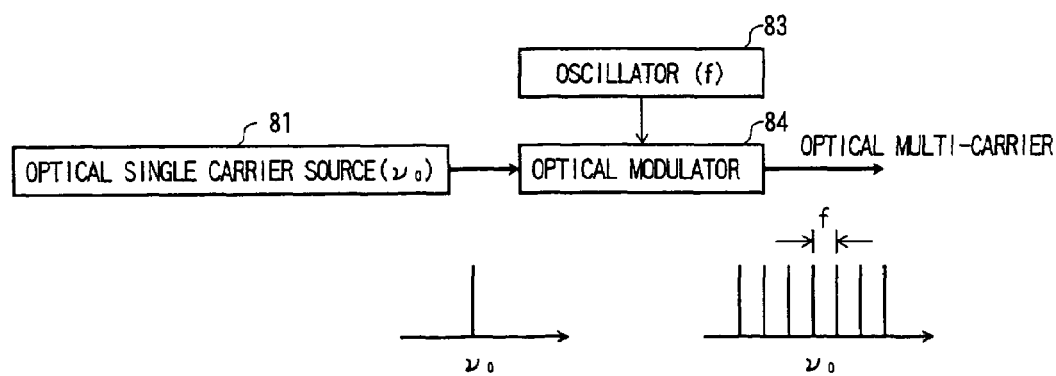
[FIG. 36]
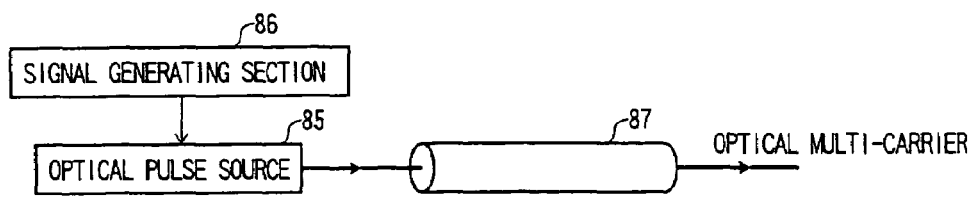

MODE-LOCKED LASER AND OPTICAL MULTI-CARRIER SOURCE USING SAME

CROSS-REFERENCE TO RELATED APPLICATION

This application is based upon and claims the benefit of priority from Japanese Patent Application No. 2004-028079, filed on Feb. 4, 2004, the entire contents of which are incorporated herein by reference.

TECHNICAL FIELD

The present invention relates to a mode-locked laser to serve as a stable light source for generating optical multi-carrier, and to an optical multi-carrier source using the same.

BACKGROUND ART

Optical multi-carrier sources that generate optical carriers at a constant frequency spacing are useful light sources for communication and measurement purposes.

FIG. 34 shows an optical multi-carrier source as a first conventional example (Non-patent document 1). This conventional example, which is suitable for generating tens of optical carriers, is configured in such a manner that optical single carrier sources 81 are provided in a number equal to the number of optical carriers, to output respective optical carriers which are combined together by a wavelength multiplexer 82. For miniaturization, small-size light sources such as distributed feedback semiconductor lasers are used as the optical single carrier sources 81.

FIG. 35 shows an optical multi-carrier source as a second conventional example. This conventional example is configured in such a manner that optical output (center optical frequency: $v_0$) of an optical single carrier source 81 such as distributed feedback semiconductor lasers is input to an optical modulator (intensity modulator, phase modulator, or the like) 84 that is driven by a periodic signal having a repetition frequency f that is output from an oscillator 83 and optical multi-carrier is produced by generating plural sidebands having a constant spacing. Where many optical carriers are necessary, as described in Non-patent document 2, output beams of plural optical single carrier sources are multiplexed and them modulated by an optical modulator. Although the frequency spacing of the optical multi-carrier is equal to the modulation frequency of the optical modulator, the linewidth and the frequency stability of the optical multi-carrier are equivalent to those of optical output of optical single carrier sources.

An optical multi-carrier source as a third conventional example employs a multimode laser such as a Fabry-Pérot laser (Non-patent document 3) or a mode-locked laser (Non-patent document 4) and generates optical multi-carrier having a constant frequency spacing. To generate many optical carriers, a bandwidth limiting means such as an optical filter is not provided in a laser resonator. On the other hand, to stabilize the oscillation light frequency, injection locking caused by external light (Non-patent document 4) or an optical frequency locking means utilizing a wavelength filter is employed.

FIG. 36 shows an optical multi-carrier source as a fourth conventional example. This conventional example is configured in such a manner that a modulating section of an optical pulse source 85 is driven by a periodic signal supplied from a signal generating section 86 and output optical pulse train is input to a waveguided optical nonlinear medium 87, whereby optical multi-carrier is generated. A spectrum broadening phenomenon based on an optical nonlinear effect such as supercontinuum generation is caused in the waveguided optical nonlinear medium 87 with the output optical pulse train of the optical pulse source 85 as a seed, whereby the number of optical carriers included in the output optical pulse train is increased. The frequency spacing of the optical multi-carrier is equal to the repetition frequency of the output optical pulse train. The optical pulse source 85 may be a light source as a combination of an optical single carrier source and an external modulator (Non-patent document 5) or a mode-locked laser (Non-patent document 6).

Non-patent document 1: "500 Gb/s (50×10 Gb/s) WDM Transmission over 4,000 km Using Broadband EDFAs and Low Dispersion Slope Fiber," OFC/IOOC '99 Postdeadline Papers, 1999.

Non-patent document 2: "12.5 GHz Spaced 1.28 Tb/s (512-Channel×2.5 Gb/s) Super-Dense WDM Transmission over 320 km SMF Using Multiwavelength Generation Technique," IEEE Photonics Technology Letters, Vol. 14, No. 3, 2002.

Non-patent document 3: "Longitudinal Mode Dependence of Transmission Characteristics for Injection Locked FP-LD," The 2002 General Assembly of the Institute of Electronics, Information and Communication Engineers, B-10-155.

Non-patent document 4: "Experimental Investigation of Injection Locking of Fundamental and Subharmonic Frequency-Modulated Active Mode-Locked Laser Diodes," IEEE Journal of Quantum Electronics, Vol. 34, No. 9, 1998.

Non-patent document 5: "Low-Noise Optical Frequency Comb Generation Using Phase Modulator," 1st Microwave/Millimeter Wave Photonics (MWP) Research Meeting, The Institute of Electronics, Information and Communication Engineers, MWP03-4, 2003.

Non-patent document 6: "More Than 1,000 Channel Optical Frequency Chain Generation from Single Supercontinuum Source with 12.5 GHz Channel Spacing," Electronics Letters, Vol. 36, No. 25, 2000.

DISCLOSURE OF THE INVENTION

Problems to be Solved by the Invention

In the configurations of the first and second conventional examples which employ the plural optical single carrier sources, it is necessary to perform a control and attain stabilization so that the optical frequencies of the respective optical single carrier sources have an equal spacing. These configurations are impractical in terms of the size and cost in the case where the number of optical carriers exceeds 100.

In the third conventional example using the multimode laser, when generating many optical carriers, mode partition noise specific to multimode lasers occurs and it deteriorates the quality of each optical carrier. On the other hand, if the bandwidth is limited in the multimode laser, it becomes difficult to generate many optical carriers even though the mode partition noise is reduced and the quality of each optical carrier is improved. That is, the bandwidth limitation in the multimode laser causes a tradeoff relationship between the quality and the number of optical carriers generated.

In the fourth conventional example, because of the use of the spectrum broadening phenomenon based on the optical nonlinear effect, the quality of each optical carrier is generally the same as or lower than the quality of optical pulse train as a seed and is lower than the quality of optical output of an optical single carrier source.

An object of the present invention is therefore to provide a mode-locked laser capable of generating high-quality optical multi-carrier and stabilizing the frequency of each of the optical multi-carrier and, as well as to provide an optical multi-carrier source using the mode-locked laser.

Means for Solving the Problems (Mode-locked Lasers)

A mode-locked laser according to a first invention includes a master laser which generates master laser light; a mode-locked laser section including, in an optical resonator, at least a modulating section, an amplifying section, and a bandwidth limiting section which reduces mode partition noise; and a signal generating section which generates a periodic signal serving for mode locking of the mode-locked laser section and to be applied to the modulating section, in which the master laser light is input to the optical resonator of the mode-locked laser section to cause injection locking. The master laser is to have an optical frequency more stable than a free-running optical frequency of the mode-locked laser section and a narrow linewidth.

A second invention is such that, in the mode-locked laser according to the first invention, the modulating section uses one of an electro-absorption modulator and a saturable absorption modulator. A third invention is such that, in the mode-locked laser according to the second invention, the mode-locked laser section includes a semiconductor laser having a plurality of electrodes that correspond to at least the modulating section and the amplifying section. A fourth invention is such that, in the mode-locked laser according to the third invention, an optical path length of the optical resonator is controlled by controlling at least one of a voltage applied to the modulating section, a current flowing through the amplifying section, and an operating temperature of the semiconductor laser.

A fifth invention is such that, in the mode-locked laser according to the first invention, the bandwidth limiting section is one of a band-pass optical filter, a diffractive grating, a Bragg grating, and a chirp Bragg grating.

A sixth invention is such that the mode-locked laser according to the first invention further includes one of an optical isolator and an optical circulator disposed between the master laser and the mode-locked laser section and stopping return light coming from the mode-locked laser section. A seventh invention is such that, in the mode-locked laser according to the first invention, the mode-locked laser section has different ports with one for inputting the master laser light thereto and the other for outputting optical output therefrom. An eighth invention is such that, in the mode-locked laser according to the first invention, the modulating section, amplifying section, and bandwidth limiting section are disposed in this order in the optical resonator of the mode-locked laser section and the master laser light is input from a modulating section side. A ninth invention is such that the mode-locked laser according to the first invention further includes: an optical modulating part which modulates the master laser light that is output from the master laser; and a signal generating section which generates a periodic signal that is synchronized with the periodic signal applied to the modulating section of the mode-locked laser section, in which the maser laser light is input to the mode-locked laser section after being modulated by the periodic signal that is output from the signal generating section.

A 10th invention is such that the mode-locked laser according to the second invention using an electro-absorption modulator or a saturable absorption modulator further includes: a modulating section average current measuring section which detects an average current flowing through the modulating section of the mode-locked laser section; and an optical resonator length control section which controls an optical path length of the optical resonator of the mode-locked laser section, in which the optical resonator length control section controls the optical path length of the optical resonator so that the average current measured by the modulating section average current measuring section is to be smaller than an average current that flows when no master laser light is input to the mode-locked laser section.

An 11th invention is such that, in the mode-locked laser according to the 10th invention, the optical resonator length control section controls the optical path length of the optical resonator so that the average current measured by the modulating section average current measuring section is to be smaller than or equal to 90% of the average current that flows when no master laser light is input to the mode-locked laser section.

A 12th invention is such that the mode-locked laser according to the first invention further includes: an optical intensity measuring section which detects average optical intensity of optical output of the mode-locked laser section; and an optical resonator length control section which controls an optical path length of the optical resonator of the mode-locked laser section, in which the optical resonator length control section controls the optical path length of the optical resonator so that the average optical intensity measured by the optical intensity measuring section is to be higher than average optical intensity that occurs when no master laser light is input to the mode-locked laser section.

A 13th invention is such that, in the mode-locked laser according to the 12th invention, the optical resonator length control section controls the optical path length of the optical resonator so that the average optical intensity measured by the optical intensity measuring section is to be higher than or equal to 105% of the average optical intensity that occurs when no master laser light is input to the mode-locked laser section.

A 14th invention is such that, in the mode-locked laser according to the first invention, the mode-locked laser further includes: a linewidth measuring part which detects a linewidth of a longitudinal mode included in optical output of the mode-locked laser section; and an optical resonator length control section which controls an optical path length of the optical resonator of the mode-locked laser section, in which the optical resonator length control section controls the optical path length of the optical resonator so that the linewidth of the longitudinal mode measured by the linewidth measuring part is to be minimum.

A 15th invention is such that the mode-locked laser according to the first invention further includes: a linewidth measuring part which detects a linewidth of a beat note of the master laser light and a longitudinal mode included in optical output of the mode-locked laser section; and an optical resonator length control section which controls an optical path length of the optical resonator of the mode-locked laser section, wherein the optical resonator length control section controls the optical path length of the optical resonator so that the linewidth of the beat note measured by the linewidth measuring part is to be minimum.

A 16th invention is such that the mode-locked laser according to the first invention further includes: a CNR measuring part which detects a carrier-to-noise ratio (hereinafter, CNR) of a longitudinal mode included in optical output of the mode-locked laser section; and an optical resonator length control section which controls an optical path length of the optical resonator of the mode-locked laser section, in which the optical resonator length control section controls the optical path length of the optical resonator so that the CNR of the longitudinal mode measured by the CNR measuring part is to be maximum.

A 17th invention is such that the mode-locked laser according to the first invention further includes: a CNR/intensity measuring part which detects a CNR or intensity of a beat note of the master laser light and a longitudinal mode included in optical output of the mode-locked laser section; and an optical resonator length control section which controls an optical path length of the optical resonator of the mode-locked laser section, in which the optical resonator length control section controls the optical path length of the optical resonator so that the CNR or the intensity of the beat note measured by the CNR/intensity measuring part is to be maximum or highest.

(Optical multi-Carrier Sources)

An optical multi-carrier source according to an 18th invention includes the mode-locked laser according to any one of the first to 17th inventions; and a waveguided optical nonlinear medium which receives optical output of the mode-locked laser and outputs optical multi-carrier that is generated by broadening a spectrum of the optical output of the mode-locked laser.

An optical multi-carrier source according to a 19th invention includes the mode-locked laser according to any one of the first to ninth inventions; a waveguided optical nonlinear medium which receives optical output of the mode-locked laser and outputs optical multi-carrier that is generated by broadening a spectrum of the optical output of the mode-locked laser; a linewidth measuring part which detects a linewidth of an optical carrier included in optical output of the waveguided optical nonlinear medium; and an optical resonator length control section which controls an optical path length of the optical resonator of the mode-locked laser section, in which the optical resonator length control section controls the optical path length of the optical resonator so that the linewidth of the optical carrier measured by the linewidth measuring part is to be minimum.

An optical multi-carrier source according to a 20th invention includes the mode-locked laser according to any one of the first to ninth inventions; a waveguided optical nonlinear medium which receives optical output of the mode-locked laser and outputs optical multi-carrier that is generated by broadening a spectrum of the optical output of the mode-locked laser; a linewidth measuring part which detects a linewidth of a beat note of the master laser light and an optical carrier included in optical output of the waveguided optical nonlinear medium; and an optical resonator length control section which controls an optical path length of the optical resonator of the mode-locked laser section, in which the optical resonator length control section controls the optical path length of the optical resonator so that the linewidth of the beat note measured by the linewidth measuring part is to be minimum.

An optical multi-carrier source according to a 21st invention includes the mode-locked laser according to any one of the first to ninth inventions; a waveguided optical nonlinear medium which receives optical output of the mode-locked laser and outputs optical multi-carrier that is generated by broadening a spectrum of the optical output of the mode-locked laser; a CNR measuring part which detects a CNR of an optical carrier included in optical output of the waveguided optical nonlinear medium; and an optical resonator length control section which controls an optical path length of the optical resonator of the mode-locked laser section, in which the optical resonator length control section controls the optical path length of the optical resonator so that the CNR of the optical carrier measured by the CNR measuring part is to be maximum.

An optical multi-carrier source according to a 22nd invention includes the mode-locked laser according to any one of the first to ninth inventions; a waveguided optical nonlinear medium which receives optical output of the mode-locked laser and outputs optical multi-carrier that is generated by broadening a spectrum of the optical output of the mode-locked laser; a CNR/intensity measuring part which detects a CNR or intensity of a beat note of the master laser light and an optical carrier included in optical output of the waveguided optical nonlinear medium; and an optical resonator length control section which controls an optical path length of the optical resonator of the mode-locked laser section, in which the optical resonator length control section controls the optical path length of the optical resonator so that the CNR or the intensity of the beat note measured by the CNR/intensity measuring part is to be maximum or highest.

A 23rd invention is such that, in the optical multi-carrier source according to any one of the 18th to 22nd invention, the waveguided optical nonlinear medium has, in all or part of its length, such a characteristic that a dispersion (unit: ps/nm/km) at an average wavelength of the optical output of the mode-locked laser exhibits a positive-to-negative decrease. A 24th invention is such that, in the optical multi-carrier source according to the 23rd invention, the waveguided optical nonlinear medium has, in all or part of its length, such a characteristic that a wavelength dispersion characteristic is represented by a convex function.

A 25th invention is such that, in the optical multi-carrier source according to any one of the 18th to 22nd inventions, the waveguided optical nonlinear medium has, in all or part of its length, such a characteristic that a dispersion (unit: ps/nm/km) at an average wavelength of the optical output of the mode-locked laser varies between 0 and −0.5 (ps/nm/km) and that a wavelength dispersion characteristic is represented by a convex function.

A 26th invention is such that, in the optical multi-carrier source according to any one of the 18th to 22nd inventions, the waveguided optical nonlinear medium is a holey fiber in which an absolute value of a dispersion slope at an average wavelength of the optical output of the mode-locked laser is 0.1 (ps/nm$^2$/km) or less and a nonlinear coefficient γ is 10 (W$^{-1}$km$^{-1}$) or more.

A 27th invention is such that the optical multi-carrier source according to any one of the 18th to 22nd inventions further includes an optical amplifier disposed between the mode-locked laser and the waveguided optical nonlinear medium. A 28th invention is such that the optical multi-carrier source according to any one of the 18th to 22nd inventions further includes an optical pulse compressor which is disposed between the mode-locked laser and the waveguided optical nonlinear medium and shortens a temporal duration of the optical output of the mode-locked laser. A 29th invention is such that, in the optical multi-carrier source according to any one of the 18th to 22nd inventions, the components of the optical multi-carrier source are of a polarization maintaining type.

Advantageous Effects of the Invention

The mode-locked laser according to the invention can reduce noise in optical output and linewidth thereof by virtue of the effect of the bandwidth limiting section disposed in the mode-locked laser section and the effect of injection locking by master laser light output from the master laser.

The mode-locked laser according to the invention can also maintain an injection-locking state for a long time by monitoring the locking state of the mode-locked laser section from the average current flowing through the modulating section of the mode-locked laser section, the average optical power of optical output, the linewidth or CNR of a longitudinal mode included in optical output, and the linewidth or CNR of a beat note of the master laser light and optical output of the mode-locked laser section, and by controlling the optical resonator length of the mode-locked laser section on the basis of the monitoring result.

The optical multi-carrier source according to the invention can stabilize the frequency of each optical carrier over a wide wavelength range and generate high-quality optical multi-carriers by inputting to the waveguided optical nonlinear medium optical output of the mode-locked laser that is reduced in noise and linewidth.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 1 shows a first embodiment of a mode-locked laser according to the present invention;

FIG. 2 shows a second embodiment of a mode-locked laser according to the invention;

FIG. 3 shows a third embodiment of a mode-locked laser according to the invention;

FIG. 4 shows a fourth embodiment of a mode-locked laser according to the invention;

FIG. 5 shows a fifth embodiment of a mode-locked laser according to the invention;

FIG. 6 shows a sixth embodiment of a mode-locked laser according to the invention;

FIG. 7 shows a locking characteristic of a mode-locked laser section 20;

FIG. 8 shows temperature dependence of the average current flowing through a modulating section 24;

FIG. 9 shows a seventh embodiment of a mode-locked laser according to the invention;

FIG. 10 shows temperature dependence of the average optical intensity of the optical output of the mode-locked laser section 20;

FIG. 11 shows an eighth embodiment of a mode-locked laser according to the invention;

FIG. 12 shows a measurement example of the linewidth of an optical carrier in optical output of a waveguided optical nonlinear medium;

FIG. 13 shows a ninth embodiment of a mode-locked laser according to the invention;

FIG. 14 shows a 10th embodiment of a mode-locked laser according to the invention;

FIG. 15 shows a measurement example of the CNR of an optical carrier in optical output of a waveguided optical nonlinear medium;

FIG. 16 shows an 11th embodiment of a mode-locked laser according to the invention;

FIG. 17 shows a 12th embodiment of a mode-locked laser according to the invention;

FIG. 18 shows a 13th embodiment of a mode-locked laser according to the invention;

FIG. 19 shows a 14th embodiment of a mode-locked laser according to the invention;

FIG. 20 shows a 15th embodiment of a mode-locked laser according to the invention;

FIG. 21 shows a 16th embodiment of a mode-locked laser according to the invention;

FIG. 22 shows a first embodiment of an optical multi-carrier source according to the invention;

FIG. 23 shows an exemplary output spectrum of the optical multi-carrier source according to the invention (with injection locking);

FIG. 24 shows an exemplary output spectrum of the optical multi-carrier source according to the invention (without injection locking);

FIG. 25 shows a first exemplary chromatic dispersion characteristic of a waveguided optical nonlinear medium 2;

FIG. 26 shows a second exemplary chromatic dispersion characteristic of the waveguided optical nonlinear medium 2;

FIG. 27 shows a third exemplary chromatic dispersion characteristic of the waveguided optical nonlinear medium 2;

FIG. 28 shows a second embodiment of an optical multi-carrier source according to the invention;

FIG. 29 shows a third embodiment of an optical multi-carrier source according to the invention;

FIG. 30 shows a fourth embodiment of an optical multi-carrier source according to the invention;

FIG. 31 shows a fifth embodiment of an optical multi-carrier source according to the invention;

FIG. 32 shows a sixth embodiment of an optical multi-carrier source according to the invention;

FIG. 33 shows a seventh embodiment of an optical multi-carrier source according to the invention;

FIG. 34 shows an optical multi-carrier source as a first conventional example;

FIG. 35 shows an optical multi-carrier source as a second conventional example; and FIG. 36 shows an optical multi-carrier source as a third conventional example.

BEST MODE FOR CARRYING OUT THE INVENTION

First Embodiment of Mode-locked Laser

FIG. 1 shows a first embodiment of a mode-locked laser according to the present invention. As shown in the figure, the mode-locked laser is composed of a master laser 10, a mode-locked laser section 20$a$ in which a modulating section 23, an amplifying section 24, and a bandwidth limiting section 25 are provided in an optical resonator that is formed by confronting mirrors 21 and 22, and a signal generating section 30. This embodiment is characterized in that the mode-locked laser section 20$a$ is provided with the bandwidth limiting section 25 and that master laser light that is output from the master laser 10 is input to the optical resonator of the mode-locked laser section 20$a$ to attain injection locking. It is desirable that the mode-locked laser section 20$a$ be provided with, in addition to an output port, a separate input port for input of master laser light. This prevents master laser light from being mixed directly into optical output of the mode-locked laser section 20$a$.

A periodic signal for mode locking is applied from the signal generating section (e.g., oscillator) 30 to the modulating section 23 of the mode-locked laser section 20a. The bandwidth limiting section 25 is a band-pass optical filter (e.g., thin-film filter), a diffractive grating, a Bragg grating, or a chirp Bragg grating. The wavelength filtering effect of the bandwidth limiting section 25 reduces mode partition noise in optical output of the mode-locked laser section 20a. This embodiment employs the configuration that the modulating section 23, the amplifying section 24, and the bandwidth limiting section 25 are arranged in this order between the mirrors 21 and 22 and master laser light is input from the modulating section 23 side. This configuration provides an advantage that the efficiency of input of master laser light to the optical resonator is increased in the case where the bandwidth limiting section 25 is a diffractive grating, a Bragg grating, or a chirp Bragg grating. However, in general, the manner of arrangement of the modulating section 23, the amplifying section 24, and the bandwidth limiting section 25 is not limited to the one according to this embodiment and they may be arranged in arbitrary order. Further, as in the case of colliding pulse mode-locked lasers, for example, a configuration is possible in which plural amplifying sections are provided and a modulating section is disposed at the center of the optical resonator.

The master laser 10 should be such that the linewidth is narrow and the optical frequency is more stable than the optical frequency when the mode-locked laser section 20a is in a free-running state. When master laser light that is output from the maser laser 10 is injected into the mode-locked laser section 20a, an injection locking phenomenon occurs that longitudinal modes in the optical output spectrum of the mode-locked laser section 20a are locked with the master laser light in optical frequency. By virtue of the effect of the bandwidth limiting section 25 and the effect of the injection locking, optical output of the mode-locked laser section 20a is reduced in noise and linewidth although the bandwidth of optical multi-carrier and the number of longitudinal modes thereof are insufficient.

Second Embodiment of Mode-locked Laser

FIG. 2 shows a second embodiment of a mode-locked laser according to the invention. This embodiment is characterized in using a mode-locked laser section 20b that is in the form of a ring resonator. In the mode-locked laser section 20b, an optical coupler 26, a modulating section 23, an amplifying section 24, a bandwidth limiting section 25, and an optical splitter 27 are connected in ring form. Master laser light that is output from a master laser 10 is input via the optical coupler 26 and optical output is output via the optical splitter 27. An optical isolator may be inserted in the optical resonator.

Third Embodiment of Mode-locked Laser

FIG. 3 shows a third embodiment of a mode-locked laser according to the invention. This embodiment is characterized in using, as a mode-locked laser 20c, a semiconductor laser in which a modulating section 23, an amplifying section 24, and a bandwidth limiting section 25 are formed on a monolithic substrate. This configuration reduces the size. A signal generating section 30 that supplies a signal to be applied to the modulating section 23 is provided with a bias voltage applying means.

Fourth Embodiment of Mode-locked Laser

FIG. 4 shows a fourth embodiment of a mode-locked laser according to the invention. This embodiment is characterized in that in each of the first to third embodiments an optical isolator 41 is disposed between the master laser 10 and the mode-locked laser section 20 (20a, 20b, or 20c) to prevent the master laser from being input with light which returns from the mode-locked laser section. In the case of the mode-locked laser section 20c that is a semiconductor laser light source, an optical isolator may also be provided in the output port.

Fifth Embodiment of Mode-locked Laser

FIG. 5 shows a fifth embodiment of a mode-locked laser according to the invention. This embodiment is characterized as follows. Where the mode-locked laser section 20 in any of the first to third embodiments has only one port (output port), master laser light that is output from the master laser 10 is injected from the output port side. Isolation between optical output of the mode-locked laser and master laser light is attained by an optical circulator 42.

Sixth Embodiment of Mode-locked Laser

FIG. 6 shows a sixth embodiment of a mode-locked laser according to the invention.

The state of injection locking of the mode-locked laser section 20 of each of the first to fifth embodiments may break due to a change in the external environment such as the temperature. This embodiment provides a configuration example in which the optical path length of the optical resonator of the mode-locked laser section 20 is controlled (the injection locking condition is adjusted) as a function of a stabilizing means for keeping a locking state stably for a long time.

Referring to the figure, a modulating section average current measuring section 43 monitors the average current flowing through the modulating section 23 of the mode-locked laser section 20 and judges the locking state. An optical resonator length control section 44 controls the optical path length of the optical resonator of the mode-locked laser section 20 in accordance with the monitoring result of the modulating section average current measuring section 43. Examples of the modulating section 23 that enables such current monitoring are an electro-absorption modulator and a saturable absorption modulator.

Exemplary methods for controlling the optical path length of the optical resonator are a method of changing the geometrical length of the optical resonator and a method of the refractive index inside the optical resonator. The former method is easier in the case where the optical path length of the optical resonator is great as in the case of the ring resonator (see FIG. 2). The latter method is easier in the case of the semiconductor laser (see FIG. 3). For example, the optical path length of the optical resonator can be controlled equivalently by changing the refractive index of the laser waveguide by changing the current flowing through the amplifying section 24, the voltage applied to the modulating section 23, or the operating temperature.

FIG. 7 shows a locking characteristic that is obtained when the optical path length of the optical resonator is changed by changing the operating temperature of the mode-locked laser section 20. The horizontal axis represents the operating temperature and the vertical axis represents the beat frequency of the optical output of the mode-locked laser section 20 and the master laser light. A flat variation portion of the plot means occurrence of injection locking.

FIG. 8 shows temperature dependence of the average current flowing through the modulating section 23 of the mode-locked laser section 20. An operating temperature range where the average current varies greatly corresponds to the locking range where injection locking occurs. Therefore, the state of injection locking with master laser light can be judged by monitoring the average current flowing through the modulating section 23. That is, the optical resonator length control section 44 can maintain a locking state by controlling the optical path length of the optical resonator so that the average current value measured by the modulating section average current measuring section 43 is kept smaller than (e.g., smaller than or equal to 90% of) an average current value of a case that no master laser light is input to the mode-locked laser section 20.

Seventh Embodiment of Mode-locked Laser

FIG. 9 shows a seventh embodiment of a mode-locked laser according to the invention. This embodiment provides another configuration example for stabilizing a locking state (adjusting the injection locking condition) of the mode-locked laser section 20.

Referring to the figure, an optical intensity measuring section 45 receives part of optical output of the mode-locked laser section 20 via an optical splitter 46 and judges the locking state by monitoring its average optical intensity. An optical resonator length control section 44 controls the optical path length of the optical resonator of the mode-locked laser section 20 in accordance with the monitoring result of the optical intensity measuring section 45. The optical path length of the optical resonator is controlled in the same manner as in the sixth embodiment.

FIG. 10 shows temperature dependence of the average optical intensity of the optical output of the mode-locked laser section 20. An operating temperature range where the average optical intensity of the optical output varies greatly corresponds to the locking range where injection locking occurs. Therefore, the state of injection locking with master laser light can be judged by monitoring the average optical intensity of the optical output. That is, the optical resonator length control section 44 can maintain a locking state by controlling the optical path length of the optical resonator so that the average optical intensity measured by the optical intensity measuring section 45 is kept higher than (e.g., higher than or equal to 105% of) average optical intensity of a case that no master laser light is input to the mode-locked laser section 20.

Eighth Embodiment of Mode-locked Laser

FIG. 11 shows an eighth embodiment of a mode-locked laser according to the invention. This embodiment provides another configuration example for stabilizing a locking state (adjusting the injection locking condition) of the mode-locked laser section 20.

Referring to the figure, an optical filter 47 and a linewidth measuring section 48 receive part of optical output of the mode-locked laser section 20 via an optical splitter 46, optically separates one of longitudinal modes included in the part of the optical output, and judges the locking state by monitoring its linewidth. An optical resonator length control section 44 controls the optical path length of the optical resonator of the mode-locked laser section 20 in accordance with the monitoring result of the linewidth measuring section 48. The optical path length of the optical resonator is controlled in the same manner as in the sixth embodiment. The linewidth measuring section 48 can measure the linewidth of one longitudinal mode by such a measuring method as a delayed self-heterodyne method.

FIG. 12 shows a measurement example of the linewidth of an optical carrier in optical output of a waveguided optical nonlinear medium (optical multi-carrier source; described later) that receives optical output of the mode-locked laser section 20, instead of a measurement example of the linewidth of a longitudinal mode in optical output of the mode-locked laser section 20. At the same optical frequency, the linewidth of a longitudinal mode in optical output of the mode-locked laser section 20 is approximately the same as the linewidth of an optical carrier in optical output of the waveguided optical nonlinear medium. In this measurement, the average wavelength of optical output of the mode-locked laser (mode-locked laser section 20) according to the invention was set at 1,552.52 nm.

In FIG. 12, black dots correspond to a case that master laser light is injected into the mode-locked laser section 20 and white dots corresponds to a case that no master laser light is injected. When the mode-locked laser section 20 is locked by using master laser light having a narrow linewidth, the linewidth of a longitudinal mode in optical output of the mode-locked laser section 20 (the linewidth of an optical carrier in optical output of the waveguided optical nonlinear medium) is minimum. Therefore, the state of injection locking with master laser light can be judged by monitoring the linewidth of an optical carrier in optical output of waveguided optical nonlinear medium as the linewidth of a longitudinal mode in optical output of the mode-locked laser section 20. That is, the optical resonator length control section 44 can maintain a locking state by controlling the optical path length of the optical resonator so that the linewidth measured by the linewidth measuring section 48 is to be minimum.

Ninth Embodiment of Mode-locked Laser

FIG. 13 shows a ninth embodiment of a mode-locked laser according to the invention. This embodiment provides still another configuration example for stabilizing a locking state (adjusting the injection locking condition) of the mode-locked laser section 20.

Referring to the figure, part of master laser light that is made to branch off by an optical splitter 46-1 and part of optical output of the mode-locked laser section 20 that is made to branch off by an optical splitter 46-2 are combined with each other by an optical mixer 49. The linewidth of a beat note of the master laser light and one (closest in frequency to the master laser light) of longitudinal modes included in the optical output is monitored by a linewidth measuring section 48 and the locking state is thereby judged. The optical resonator length control section 44 controls the optical path length of the optical resonator of the mode-locked laser section 20 in accordance with the monitoring result of the linewidth measuring section 48. The optical path length of the optical resonator is controlled in the same manner as in the sixth embodiment. The optical mixer 49 may be an optical detector such as a photodetector. The linewidth can be measured more easily by a configuration in which optical heterodyne detection is performed, for example, by shifting the frequency of master laser light with an optical frequency shifter 50.

When the mode-locked laser section 20 is locked with master laser light, the linewidth of a beat note of the master laser light and a longitudinal mode included in optical output of the mode-locked laser section 20 are at minimum. Therefore, the optical resonator length control section 44 can maintain a locking state by controlling the optical path length of the optical resonator so that the beat note linewidth measured by the linewidth measuring section 48 is to be minimum.

10th Embodiment of Mode-Locked Laser

FIG. 14 shows a 10th embodiment of a mode-locked laser according to the invention. This embodiment provides yet another configuration example for stabilizing a locking state (adjusting the injection locking condition) of the mode-locked laser section 20.

Referring to the figure, an optical filter 47 and a CNR measuring section 51 receive part of optical output of the mode-locked laser section 20 via an optical splitter 46, optically separates one of longitudinal modes included in the part of the optical output, and judges the locking state by monitoring its CNR. An optical resonator length control section 44 controls the optical path length of the optical resonator of the mode-locked laser section 20 in accordance with the monitoring result of the CNR measuring section 51. The optical path length of the optical resonator is controlled in the same manner as in the sixth embodiment. The CNR measuring section 51 can measure the CNR of a longitudinal mode by integrating, in a signal band, relative intensity noise that is measured by a photodetector and an optical spectrum analyzer, for example.

FIG. 15 shows a measurement example of the CNR of an optical carrier in optical output of a waveguided optical nonlinear medium (optical multi-carrier source; described later) that receives optical output of the mode-locked laser section 20, instead of a measurement example of the CNR of a longitudinal mode in optical output of the mode-locked laser section 20. The amount of improvement in the CNR of a longitudinal mode in optical output of the mode-locked laser section 20 due to injection of master laser light is approximately the same as the amount of improvement in the CNR of an optical carrier in optical output of the waveguided optical nonlinear medium. In this measurement, the average wavelength of optical output of the mode-locked laser (mode-locked laser section 20) according to the invention was set at 1,552.52 nm.

In FIG. 15, black dots correspond to a case that master laser light is injected into the mode-locked laser section 20 and white dots corresponds to a case that no master laser light is injected. When the mode-locked laser section 20 is locked by using master laser light, the CNR of optical output of the mode-locked laser section 20 (an optical carrier in optical output of the waveguided optical nonlinear medium) is maximum. Therefore, the state of injection locking with master laser light can be judged by monitoring the CNR of a longitudinal mode in optical output (the CNR of an optical carrier in optical output of waveguided optical nonlinear medium). That is, the optical resonator length control section 44 can maintain a locking state by controlling the optical path length of the optical resonator so that the CNR measured by the CNR measuring section 51 is to be maximum.

11th Embodiment of Mode-Locked Laser

FIG. 16 shows an 11th embodiment of a mode-locked laser according to the invention. This embodiment provides a further configuration for stabilizing a locking state (adjusting the injection locking condition) of the mode-locked laser section 20.

Referring to the figure, part of master laser light that is made to branch off by an optical splitter 46-1 and part of optical output of the mode-locked laser section 20 that is made to branch off by an optical splitter 46-2 are combined with each other by an optical mixer 49. The CNR or intensity of a beat note of the master laser light and one (closest in frequency to the master laser light) of longitudinal modes included in the optical output is monitored by the CNR/intensity measuring section 52 and the locking state is thereby judged. The optical resonator length control section 44 controls the optical path length of the optical resonator of the mode-locked laser section 20 in accordance with the monitoring result of the CNR/intensity measuring section 52. The optical path length of the optical resonator is controlled in the same manner as in the sixth embodiment. The optical mixer 49 may be an optical detector such as a photodetector. The CNR can be measured more easily by a configuration in which optical heterodyne detection is performed, for example, by shifting the frequency of master laser light with an optical frequency shifter 50.

When the mode-locked laser section 20 is locked with master laser light, the CNR of a beat note of the master laser light and a longitudinal mode included in optical output of the mode-locked laser section 20 is at maximum and its intensity is highest. Therefore, the optical resonator length control section 44 can maintain a locking state by controlling the optical path length of the optical resonator so that the CNR or intensity of a beat note measured by the CNR/intensity measuring section 52 to be maximum or highest.

12th Embodiment of Mode-Locked Laser

FIG. 17 shows a 12th embodiment of a mode-locked laser according to the invention. This embodiment is characterized in that it is provided with an optical modulating part 60 for 20 modulating master laser light that is supplied from a master laser 10 and is to be input to a mode-locked laser section 20 and a signal generating section 61 for generating a periodic signal that is synchronized with a periodic signal that is input to a modulating section of the mode-locked laser section 20, and that the master laser light is modulated according to the periodic signal that is output from the signal generating section 61. The frequencies of the two period signals are identical or one of those is an integer multiple of the other. A configuration is possible in which the master laser 10 is modulated directly instead of using the optical modulating part 60.

13th Embodiment of Mode-Locked Lasers

FIG. 18 shows a 13th embodiment of mode-locked lasers according to the invention. This embodiment is characterized in that a master laser 10 for generating master laser light (reference frequency light) is shared by nodes 100*m* and 100*s* that are connected to each other via an optical fiber transmission line 200 and are each equipped with a mode-locked laser according to the invention. Plural nodes may be connected to the node 100*m*.

That is, each of a set of the master laser 10, a mode-locked laser section 20*m*, and a signal generating section 30*m* of the node 100*m* and a set of a mode-locked laser section 20*s* and a signal generating section 30*s* of the node 100*s* corresponds to any of the mode-locked lasers according to the first to 12th embodiments. In this embodiment, part of master laser light that is output from the master laser 10 of the node 100m is made to branch off by an optical splitter 46, transmitted to the node 100s via the optical fiber transmission line 200, and input to the mode-locked laser section 20s to cause injection locking.

If the output frequencies f of the signal generating section 30m of the node 100m and the signal generating section 30s of the node 100s are set identical, optical output beams (optical multi-carriers) having the same frequency spacing f can be generated in the respective nodes. In addition, by virtue of the effect of the injection locking phenomena caused by the same master laser light, the optical output beams can be reduced in noise and linewidth.

A configuration is possible in which as in the case of the sixth to 11th embodiments the mode-locked laser sections 20m and 20s of the respective nodes maintain a locking state for a long time by monitoring the state of injection locking of the mode-locked laser section and controlling the optical path length of the optical resonator on the basis of the monitoring result. Another configuration is possible in which the node 100s is equipped with a master laser that stands by for the case that the master laser 10 of the node 100m is out of order.

14th Embodiment of Mode-Locked Lasers

FIG. 19 shows a 14th embodiment of mode-locked lasers according to the invention. This embodiment is characterized in that master laser light that is transmitted via the optical fiber transmission line 200 in the 13th embodiment is modulated according to a periodic signal for mode locking that is supplied from the signal generating section 30 of the node 100m to the mode-locked laser section 20m, and that in the node 100s the periodic signal superimposed on the master laser light is extracted and supplied to the mode-locked laser section 20s.

That is, part of master laser light that is output from the master laser 10 of the node 100m is made to branch off by an optical splitter 46m, input to an optical modulating section 71, modulated there according to a periodic signal that is output from the signal generating section 30, and transmitted to the node 100s via the optical fiber transmission line 200. In the node 100s, an optical splitter 46s splits the master laser light into two parts, one of which is input to the mode-locked laser section 20s to effect injection locking. The other part of the master laser light is received by an optical receiver 72, and the periodic signal from the signal generating section 30 of the node 100m is extracted and input to mode-locked laser section 20s via a signal generating section (amplifier) 31. The other part of the configuration is the same as in the 13th embodiment.

15th Embodiment of Mode-Locked Lasers

FIG. 20 shows a 15th embodiment of mode-locked lasers according to the invention. This embodiment is characterized in that in the 14th embodiment a periodic signal is superimposed on optical output of a dedicated light source 73 rather than on master laser light and is transmitted to the node 100s via an optical fiber transmission line 201. That is, a periodic signal that is output from the signal generating section 30 is input to the mode-locked laser section 20m via a signal generating section (amplifier) 31m, and the periodic signal that is output from the signal generating section 30 is also input to the light source 73 to modulate optical output of the light source 73. The other part of the configuration is the same as in the 14th embodiment. The periodic signal that is output from the signal generating section 30 may be used for directly driving the mode-locked laser section 20m instead of going through the signal generating section (amplifier) 31m. Optical output of the light source 73 may be transmitted via the single optical fiber transmission line 200 by means of wavelength multiplexing through an optical multiplexer and an optical demultiplexer.

16th Embodiment of Mode-Locked Lasers

FIG. 21 shows a 16th embodiment of mode-locked lasers according to the invention. This embodiment is characterized in that in the 15th embodiment the frequency f of a periodic signal is divided to f/K (K being an integer) in the signal generating section 30 of the node 100m, and optical output of the light source 73 is modulated according to the periodic signal having the frequency f/K and then transmitted to the node 100s. Signal generating sections 32m and 32s of the nodes 100m and 100s convert the periodic signals having the frequency f/K to periodic signals havin the frequency f by multiplying the frequency f/K and inputs those signals to the mode-locked laser sections 20m and 20s, respectively. The other part of the configuration is the same as in the 15th embodiment. Optical output of the light source 73 may be transmitted via the single optical fiber transmission line 200 by means of wavelength multiplexing through an optical multiplexer and an optical demultiplexer.

In the case where an optical signal modulated according to a periodic signal having the frequency f may be distorted in traveling through the optical fiber transmission line 200 or 201, this embodiment makes it possible to avoid such distortion that might otherwise occur in the optical fiber transmission line 200 or 201 by transmitting an optical signal that has been modulated according to a periodic signal having the lower frequency f/K.

In the 13th to 16th embodiments, master laser light to be used for injection locking of the mode-locked laser sections 20 is transmitted between plural nodes and, in addition, a periodic signal to be used for mode locking of the mode-locked laser sections 20 is transmitted between the plural nodes. This makes it possible to equalize the optical frequencies and the optical phases of optical multi-carriers generated by the respective nodes. Thus-configured mode-locked lasers enable coherent WDM communication using optical homodyne, optical heterodyne, or the like.

First Embodiment of Optical Multi-carrier Source

By virtue of the effect of the bandwidth limiting section 25 provided in the mode-locked laser section 20 and the effect of injection locking caused by master laser light that is output from the master laser 10, the above-described mode-locked lasers realize reduction of noise and the linewidth of optical output that cannot be realized by the mode-locked lasers of Non-patent document 4 etc. However, since the bandwidth and the number of longitudinal modes of optical multi-carrier are reduced, the following configuration is employed to generate many optical multi-carriers.

As shown in FIG. 22, the optical multi-carrier source according to the invention has a configuration in which optical output of the mode-locked laser according to the invention is input to a waveguided optical nonlinear medium 2. Although this embodiment shows only the master laser 10, the mode-locked laser section 20, and the signal generating section 30 as basic components of the mode-locked laser according to the invention, the mode-locked laser may have any of the configurations according to the first to 12th embodiments described above. The waveguided optical nonlinear medium 2 causes a spectrum broadening phenomenon based on an optical nonlinear effect such as supercontinuum generation with optical output of the mode-locked laser according to the invention as a seed and thereby outputs optical multi-carrier in which the number of longitudinal modes is increased by a factor of several tens to several hundreds. Since longitudinal modes included in optical output of the mode-locked laser according to the invention are locked with master laser light in optical frequency and hence is reduced in noise and linewidth, resulting optical multi-carrier of the optical multi-carrier source is also of low noise and has a narrow linewidth.

FIGS. 23 and 24 show exemplary output spectra of the optical multi-carrier source according to the invention. FIG. 23 shows a case that the mode-locked laser according to the invention is injection-locked by master laser light. FIG. 24 shows a case that it is not injection-locked. The vertical width of each spectrum that looks like a black band because of densely arranged optical carriers corresponds to visibility of each optical carrier; the quality of optical output is improved as the vertical width increases. These two exemplary output spectra show that the visibility is improved by the injection locking that is caused by master laser light. The improvement by the injection locking is particularly remarkable in wavelength ranges that are distant from an average wavelength (1,552.52 nm) of optical output of the mode-locked laser according to the invention.

The visibility of an optical carrier will now be described. In general, the visibility is defined as (M−m)/(M+m), where M and m are a maximum value and a minimum value of an observable (in this embodiment, spectrum intensity) that varies with the frequency or time. The visibility is 100% and 0% when m=0 and m=M, respectively. In FIGS. 23 and 24, the vertical width is represented by M/m; the width increases as the visibility heightens, the width decreases as the visibility lowers.

In the mode-locked laser that is used in the optical multi-carrier source according to the invention, as described in the sixth embodiment (FIG. 6) to the 11th embodiment (FIG. 16), a locking state can be maintained for a long time by monitoring the state of injection locking of the mode-locked laser section by using the average current flowing through the modulating section of the mode-locked laser section 20, the average optical power of optical output, the linewidth or CNR of a longitudinal mode included in optical output, or the linewidth or CNR of a beat note of the master laser light and optical output of the mode-locked laser section 20 and controlling the optical path length of the optical resonator of the mode-locked laser section 20 on the basis of the monitoring result.

As described above, instead of monitoring a longitudinal mode included in optical output of the mode-locked laser section 20 used in the eighth embodiment (FIG. 11), the ninth embodiment (FIG. 13), the 10th embodiment (FIG. 14), and the 11th embodiment (FIG. 16), an optical carrier in optical output of the waveguided optical nonlinear medium 2 used in this embodiment may be monitored in a similar manner.

FIG. 25 shows a first exemplary chromatic dispersion characteristic of the waveguided optical nonlinear medium 2. The waveguided optical nonlinear medium 2 has such a characteristic that the dispersion (unit: ps/nm/km) at the average wavelength of optical output of the mode-locked laser according to the invention exhibits a positive-to-negative decrease in all or part of its length. This kind of chromatic dispersion characteristic can be realized by, for example, a single-mode waveguide whose core diameter varies in a taper-like manner in the longitudinal direction.

FIG. 26 shows a second exemplary chromatic dispersion characteristic of the waveguided optical nonlinear medium 2. In this example, the waveguided optical nonlinear medium 2 has, in addition to the same decreasing characteristic as in the first exemplary chromatic dispersion characteristic, a characteristic that the chromatic dispersion curve exhibits a convex function in all or part of its length. This kind of chromatic dispersion characteristic can be realized by, for example, a single-mode waveguide whose core diameter varies in a taper-like manner in the longitudinal direction and that has double, triple, or quadruple clad. The spectra of FIGS. 23 and 24 are examples of optical multi-carrier produced by using an optical fiber of this design.

FIG. 27 shows a third exemplary chromatic dispersion characteristic of the waveguided optical nonlinear medium 2. This chromatic dispersion characteristic is such that in all or part of its length the dispersion at the average wavelength of optical output of the mode-locked laser according to the invention is in a range of 0 to −0.5 (ps/nm/km) and the chromatic dispersion curve exhibits a convex function. This kind of chromatic dispersion characteristic can be realized by, for example, a single-mode waveguide that has double, triple, or quadruple clad.

The waveguided optical nonlinear medium having the chromatic dispersion characteristic of FIG. 25, 26, or 27 can be realized by using a holey fiber called a microstructure fiber or a photonic crystal fiber. For example, this holey fiber may be such that the absolute value of the dispersion slope at the average wavelength of optical output of the mode-locked laser according to the invention is 0.1 (ps/nm$^2$/km) or less and the nonlinear coefficient γ is 10 (W$^{-1}$km$^{-1}$) or more. Being high in the optical confinement of propagation light by using this, this holey fiber can realize an optical waveguide having a large nonlinear coefficient and hence can generate optical multi-carrier very efficiently.

Second Embodiment of Optical Multi-Carrier Source

FIG. 28 shows a second embodiment of an optical multi-carrier source according to the invention. This embodiment is characterized in that an optical amplifier 3 is disposed between the mode-locked laser according to the invention (master laser 10, mode-locked laser section 20, and signal generating section 30) and the waveguided optical nonlinear medium 2 of the first embodiment.

Where the carrier frequency spacing of the optical multi-carrier source, that is, the repetition frequency of the mode-locked laser is high, the energy per one output pulse of the mode-locked laser is low and the optical nonlinear effect is small, which disables generation of many optical carriers. Consequently, amplifying optical output of the mode-locked laser with the optical amplifier 3 as in this embodiment allows the waveguided optical nonlinear medium 2 to generate many optical carriers even in the case where the repetition frequency is high.

Third Embodiment of Optical Multi-Carrier Source

FIG. 29 shows a third embodiment of an optical multi-carrier source according to the invention. This embodiment is characterized in that an optical pulse compressor 4 is disposed between the mode-locked laser according to the invention (master laser 10, mode-locked laser section 20, and signal generating section 30) and the waveguided optical nonlinear medium 2 of the first embodiment.

Inputting optical output of the mode-locked laser to the optical pulse compressor 4 increases the peak intensity and thereby allows the waveguided optical nonlinear medium 2 to generate many optical carriers. Where the degree of chirping of optical pulse train is high, a dispersive medium such as an optical fiber or a Bragg grating capable of canceling out chirping is used as the optical pulse compressor 4. Where the degree of chirping of optical pulse train is low, a soliton effect or the like in an optical fiber is utilized.

Fourth to Seventh Embodiments of Optical Multi-Carrier Sources

FIG. 30-33 show fourth to seventh embodiments of optical multi-carrier sources according to the invention. These embodiments of optical multi-carrier sources correspond to the 13th to 16th embodiments of mode-locked lasers according to the invention shown in FIGS. 18-21, respectively. Optical output of the mode-locked laser section 20*m* of each embodiment is input to a waveguided optical nonlinear medium 2*m* and optical output of the mode-locked laser section 20*s* is input to a waveguided optical nonlinear medium 2*s*, whereby many optical carriers are generated by each of nodes 100*m* and 100*s*.

In each embodiment of an optical multi-carrier source, as described in the 13th to 16th embodiments of mode-locked lasers, master laser light to be used for injection locking of the mode-locked laser section 20 is transmitted between plural nodes and, in addition, a periodic signal to be used for mode locking of the mode-locked laser sections 20 is transmitted between the plural nodes. This makes it possible to equalize the optical frequencies and the optical phases of optical multi-carriers generated by the respective nodes. Thus-configured optical multi-carrier sources enable coherent WDM communication using optical homodyne, optical heterodyne, or the like.

In the above-described optical multi-carrier sources, optical multi-carrier can be generated stably by making all the components maintain optical polarization.

The invention is not limited to the above embodiments and various modifications may be made without departing from the spirit and scope of the invention. Any improvement may be made in part or all of the components.

INDUSTRIAL APPLICABILITY

The invention can be utilized for providing an optical frequency reference for optical signals that transmit in a long-distance, high-density WDM optical fiber communication systems, as well as an optical multi-carrier source for that purpose.

The invention can be utilized for providing an optical multi-carrier source for supplying optical carriers in a WDM optical access network.

The invention can be utilized for providing an optical multi-carrier source for generating millimeter waves in the WDM radio-on-fiber systems.

The invention can be utilized for providing an optical multi-carrier source that is used for calibration of optical measuring instruments such as an optical frequency counter and an optical spectrum analyzer.

The invention can be utilized for providing a wideband coherent light source for medical optics such as the optical coherence tomography.

The invention claimed is:

1. A mode-locked laser comprising:
a master laser which generates master laser light;
a mode-locked laser section including at least a modulating section, an amplifying section, and a bandwidth limiting section in an optical resonator, the bandwidth limiting section reducing mode partition noise;
a signal generating section which generates a periodic signal serving for mode locking of said mode-locked laser section and to be applied to said modulating section, wherein
said master laser light is input to the optical resonator of said mode-locked laser section to cause injection locking;
said modulating section is one of an electro-absorption modulator and a saturable absorption modulator;
a modulating section average current measuring section which detects an average current flowing through the modulating section of said mode-locked laser section; and
an optical resonator length control section which controls an optical path length of the optical resonator of said mode-locked laser section, wherein
said optical resonator length control section controls the optical path length of the optical resonator so that the average current measured by said modulating section average current measuring section is to be smaller than an average current that flows when no master laser light is input to said mode-locked laser section.

2. The mode-locked laser according to claim 1, characterized in that
said optical resonator length control section controls the optical path length of the optical resonator so that the average current measured by said modulating section average current measuring section is to be smaller than or equal to 90% of the average current that flows when no master laser light is input to said mode-locked laser section.

3. A mode-locked laser comprising:
a master laser which generates master laser light;
a mode-locked laser section including at least a modulating section, an amplifying section, and a bandwidth limiting section in an optical resonator, the bandwidth limiting section reducing mode partition noise;
a signal generating section which generates a periodic signal serving for mode locking of said mode-locked laser section and to be applied to said modulating section, wherein
said master laser light is input to the optical resonator of said mode-locked laser section to cause injection locking;
an optical intensity measuring section which detects average optical intensity of optical output of said mode-locked laser section; and
an optical resonator length control section which controls an optical path length of the optical resonator of said mode-locked laser section, wherein
said optical resonator length control section controls the optical path length of the optical resonator so that the average optical intensity measured by said optical intensity measuring section is to be higher than average optical intensity that occurs when no master laser light is input to said mode-locked laser section.

4. The mode-locked laser according to claim 3, characterized in that
said optical resonator length control section controls the optical path length of the optical resonator so that the average optical intensity measured by said optical intensity measuring section is to be higher than or equal to 105% of the average optical intensity that occurs when no master laser light is input to said mode-locked laser section.

5. A mode-locked laser comprising:

a master laser which generates master laser light;

a mode-locked laser section including at least a modulating section, an amplifying section, and a bandwidth limiting section in an optical resonator, the bandwidth limiting section reducing mode partition noise;

a signal generating section which generates a periodic signal serving for mode locking of said mode-locked laser section and to be applied to said modulating section, wherein said master laser light is input to the optical resonator of said mode-locked laser section to cause injection locking;

a linewidth measuring part which detects a linewidth of a longitudinal mode included in optical output of said mode-locked laser section; and an optical resonator length control section which controls an optical path length of the optical resonator of said mode-locked laser section, wherein said optical resonator length control section controls the optical path length of the optical resonator so that the linewidth of the longitudinal mode measured by said linewidth measuring part is to be minimum.

6. A mode-locked laser comprising:

a master laser which generates master laser light;

a mode-locked laser section including at least a modulating section, an amplifying section, and a bandwidth limiting section in an optical resonator, the bandwidth limiting section reducing mode partition noise;

a signal generating section which generates a periodic signal serving for mode locking of said mode-locked laser section and to be applied to said modulating section, wherein said master laser light is input to the optical resonator of said mode-locked laser section to cause injection locking;

a linewidth measuring part which detects a linewidth of a beat note of said master laser light and a longitudinal mode included in optical output of said mode-locked laser section; and an optical resonator length control section which controls an optical path length of the optical resonator of said mode-locked laser section, wherein said optical resonator length control section controls the optical path length of the optical resonator so that the linewidth of the beat note measured by said linewidth measuring part is to be minimum.

7. A mode-locked laser comprising:

a master laser which generates master laser light;

a mode-locked laser section including at least a modulating section, an amplifying section, and a bandwidth limiting section in an optical resonator, the bandwidth limiting section reducing mode partition noise;

a signal generating section which generates a periodic signal serving for mode locking of said mode-locked laser section and to be applied to said modulating section, wherein said master laser light is input to the optical resonator of said mode-locked laser section to cause injection locking;

a CNR measuring part which detects a CNR of a longitudinal mode included in optical output of said mode-locked laser section; and an optical resonator length control section which controls an optical path length of the optical resonator of said mode-locked laser section, wherein said optical resonator length control section controls the optical path length of the optical resonator so that the CNR of the longitudinal mode measured by said CNR measuring part is to be maximum.

8. A mode-locked laser comprising:

a master laser which generates master laser light;

a mode-locked laser section including at least a modulating section, an amplifying section, and a bandwidth limiting section in an optical resonator, the bandwidth limiting section reducing mode partition noise;

a signal generating section which generates a periodic signal serving for mode locking of said mode-locked laser section and to be applied to said modulating section, wherein said master laser light is input to the optical resonator of said mode-locked laser section to cause injection locking;

a CNR/intensity measuring part which detects a CNR or intensity of a beat note of said master laser light and a longitudinal mode included in optical output of said mode-locked laser section; and an optical resonator length control section which controls an optical path length of the optical resonator of said mode-locked laser section, wherein said optical resonator length control section controls the optical path length of the optical resonator so that the CNR or intensity of the beat note measured by said CNR/intensity measuring part is to be maximum or highest.

9. An optical multi-carrier source;

employing a mode-locked laser comprising:

a master laser which generates master laser light;

a mode-locked laser section including at least a modulating section, an amplifying section, and a bandwidth limiting section in an optical resonator, the bandwidth limiting section reducing mode partition noise;

a signal generating section which generates a periodic signal serving for mode locking of said mode-locked laser section and to be applied to said modulating section, wherein said master laser light is input to the optical resonator of said mode-locked laser section to cause injection locking;

a waveguided optical nonlinear medium which receives optical output of said mode-locked laser and outputs optical multi-carrier that is generated by broadening a spectrum of the optical output of the mode-locked laser;

a linewidth measuring part which detects a linewidth of an optical carrier included in optical output of said waveguided optical nonlinear medium; and an optical resonator length control section which controls an optical path length of the optical resonator of said mode-locked laser section, wherein said optical resonator length control section controls the optical path length of the optical resonator so that the linewidth of the optical carrier measured by said linewidth measuring part is to be minimum.

10. An optical multi-carrier source; employing a mode-locked laser comprising:
  a master laser which generates master laser light;
  a mode-locked laser section including at least a modulating section, an amplifying section, and a bandwidth limiting section in an optical resonator, the bandwidth limiting section reducing mode partition noise;
  a signal generating section which generates a periodic signal serving for mode locking of said mode-locked laser section and to be applied to said modulating section, wherein
  said master laser light is input to the optical resonator of said mode-locked laser section to cause injection locking;
  a waveguided optical nonlinear medium which receives optical output of said mode-locked laser and outputs optical multi-carrier that is generated by broadening a spectrum width of said optical output;
  a linewidth measuring part which detects a linewidth of a beat note of said master laser light and an optical carrier included in optical output of said waveguided optical nonlinear medium; and
  an optical resonator length control section which controls an optical path length of the optical resonator of said mode-locked laser section, wherein
  said optical resonator length control section controls the optical path length of the optical resonator so that the linewidth of the beat note measured by said linewidth measuring part is to be minimum.

11. An optical multi-carrier source
employing a mode-locked laser comprising:
a master laser which generates master laser light;
a mode-locked laser section including at least a modulating section, an amplifying section, and a bandwidth limiting section in an optical resonator, the bandwidth limiting section reducing mode partition noise;
a signal generating section which generates a periodic signal serving for mode locking of said mode-locked laser section and to be applied to said modulating section, wherein
said master laser light is input to the optical resonator of said mode-locked laser section to cause injection locking;
a waveguided optical nonlinear medium which receives optical output of said mode-locked laser and outputs optical multi-carrier that is generated by broadening a spectrum of the optical output of the mode-locked laser;
a CNR measuring part which detects a CNR of an optical carrier included in optical output of said waveguided optical nonlinear medium; and
an optical resonator length control section which controls an optical path length of the optical resonator of said mode-locked laser section, wherein
said optical resonator length control section controls the optical path length of the optical resonator so that the CNR of the optical carrier measured by said CNR measuring part is to be maximum.

12. An optical multi-carrier source
employing a mode-locked laser comprising:
a master laser which generates master laser light;
a mode-locked laser section including at least a modulating section, an amplifying section, and a bandwidth limiting section in an optical resonator, the bandwidth limiting section reducing mode partition noise;
  a signal generating section which generates a periodic signal serving for mode locking of said mode-locked laser section and to be applied to said modulating section, wherein
  said master laser light is input to the optical resonator of said mode-locked laser section to cause injection locking;
  a waveguided optical nonlinear medium which receives optical output of said mode-locked laser and outputs optical multi-carrier that is generated by broadening a spectrum of the optical output of the mode-locked laser;
  a CNR/intensity measuring part which detects a CNR or intensity of a beat note of said master laser light and an optical carrier included in optical output of said waveguided optical nonlinear medium; and
  an optical resonator length control section which controls an optical path length of the optical resonator of said mode-locked laser section, wherein
  said optical resonator length control section controls the optical path length of the optical resonator so that the CNR or intensity of the beat note measured by said CNR/intensity measuring part is to be maximum or highest.

13. The optical multi-carrier source according to any one of claims 9 to 12, characterized in that
  said waveguided optical nonlinear medium has, in all or part of its length, such a characteristic that a dispersion (unit: ps/nm/km) at an average wavelength of the optical output of said mode-locked laser exhibits a positive-to-negative decrease.

14. The optical multi-carrier source according to any one of claims 9 to 12, characterized in that
  said waveguided optical nonlinear medium has, in all or part of its length, such a characteristic that a wavelength dispersion characteristic is represented by a convex function.

15. The optical multi-carrier source according to any one of claims 9 to 12, characterized in that
  said waveguided optical nonlinear medium has, in all or part of its length, such a characteristic that a dispersion (unit: ps/nm/km) at an average wavelength of the optical output of said mode-locked laser varies between 0 and −0.5 (ps/nm/km) and that a wavelength dispersion characteristic is represented by a convex function.

16. The optical multi-carrier source according to any one of claims 9 to 12, characterized in that
  said waveguided optical nonlinear medium is a holey fiber in which an absolute value of a dispersion slope at an average wavelength of said optical output of said mode-locked laser is 0.1 (ps/nm$^2$/km) or less and a nonlinear coefficient γ is 10 (W$^{-1}$km$^{-1}$) or more.

17. The optical multi-carrier source according to any one of claims 9 to 12, characterized by further comprising
  an optical amplifier disposed between said mode-locked laser and said waveguided optical nonlinear medium.

18. The optical multi-carrier source according to any one of claims 9 to 12, characterized by further comprising
  an optical pulse compressor disposed between said mode-locked laser and said waveguided optical nonlinear medium, and shortening a temporal duration of the optical output of said mode-locked laser.

19. The optical multi-carrier source according to any one of claims 9 to 12, characterized in that components of said optical multi-carrier source maintain optical polarization.

* * * * *